(12) United States Patent
Lin et al.

(10) Patent No.: US 11,056,594 B2
(45) Date of Patent: *Jul. 6, 2021

(54) SEMICONDUCTOR DEVICE HAVING FIN STRUCTURES

(71) Applicant: Taiwan Semiconductor Manufacturing Co., Ltd., Hsinchu (TW)

(72) Inventors: Yu-Kuan Lin, Taipei (TW); Chang-Ta Yang, Hsinchu (TW); Ping-Wei Wang, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/908,441

(22) Filed: Jun. 22, 2020

(65) Prior Publication Data

US 2020/0335620 A1 Oct. 22, 2020

Related U.S. Application Data

(63) Continuation of application No. 15/988,045, filed on May 24, 2018, now Pat. No. 10,727,343.

(Continued)

(51) Int. Cl.
*H01L 29/78* (2006.01)
*H01L 29/66* (2006.01)
(Continued)

(52) U.S. Cl.
CPC ........ *H01L 29/785* (2013.01); *H01L 21/0228* (2013.01); *H01L 21/3083* (2013.01); *H01L 21/823821* (2013.01); *H01L 27/0924* (2013.01); *H01L 29/0649* (2013.01); *H01L 29/4232* (2013.01); *H01L 29/6681* (2013.01); *H01L 29/66545* (2013.01)

(58) Field of Classification Search
CPC ............... H01L 29/785; H01L 21/0228; H01L 29/4232; H01L 29/0649; H01L 29/6681; H01L 21/3083; H01L 29/0688; H01L 21/823821; H01L 27/0924; H01L 29/66545

See application file for complete search history.

(56) References Cited

U.S. PATENT DOCUMENTS

2014/0339641 A1* 11/2014 Hong ................. H01L 27/0886
257/368
2017/0194487 A1* 7/2017 Chen .................. H01L 29/0869
2018/0040602 A1* 2/2018 Lee .................... H01L 29/78603

* cited by examiner

*Primary Examiner* — Steven H Loke
*Assistant Examiner* — Juanita B Rhodes
(74) *Attorney, Agent, or Firm* — McClure, Qualey & Rodack, LLP

(57) ABSTRACT

A semiconductor device structure is provided. The structure includes a semiconductor substrate having a well pick-up region and an active region adjacent to the well pick-up region. The semiconductor device structure also includes a first fin structure with a first width and a third fin structure with a third width formed adjacent to each other in the well pick-up region and a second fin structure with a second width and a fourth fin structure with a fourth width formed adjacent to each other in the active region. The first width is different than the second width, the third width is different than the fourth width, and the first width is substantially equal to or greater than the third width.

20 Claims, 16 Drawing Sheets

Related U.S. Application Data

(60) Provisional application No. 62/564,391, filed on Sep. 28, 2017.

(51) Int. Cl.
*H01L 27/092* (2006.01)
*H01L 29/06* (2006.01)
*H01L 29/423* (2006.01)
*H01L 21/02* (2006.01)
*H01L 21/308* (2006.01)
*H01L 21/8238* (2006.01)

SEMICONDUCTOR DEVICE HAVING FIN STRUCTURES

CROSS REFERENCE TO RELATED APPLICATIONS

This application is a Continuation of U.S. patent application Ser. No. 15/988,045, filed May 24, 2018, now U.S. Pat. No. 10,727,343, which claims the benefit of U.S. Provisional Application No. 62/564,391, filed on Sep. 28, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFETs and methods of fabricating FinFETs have been generally adequate for their intended purposes, they have not been entirely satisfactory in all respects. For example, as the size of the fin (e.g., the fin width) and the fin-to-fin space (i.e., the distance between two adjacent fins) are reduced, the resistance of the well pick-up region is increased due to the interdiffusion between the well pick-up regions with different conductivity types, and thus the electrical performance of the semiconductor device is reduced. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
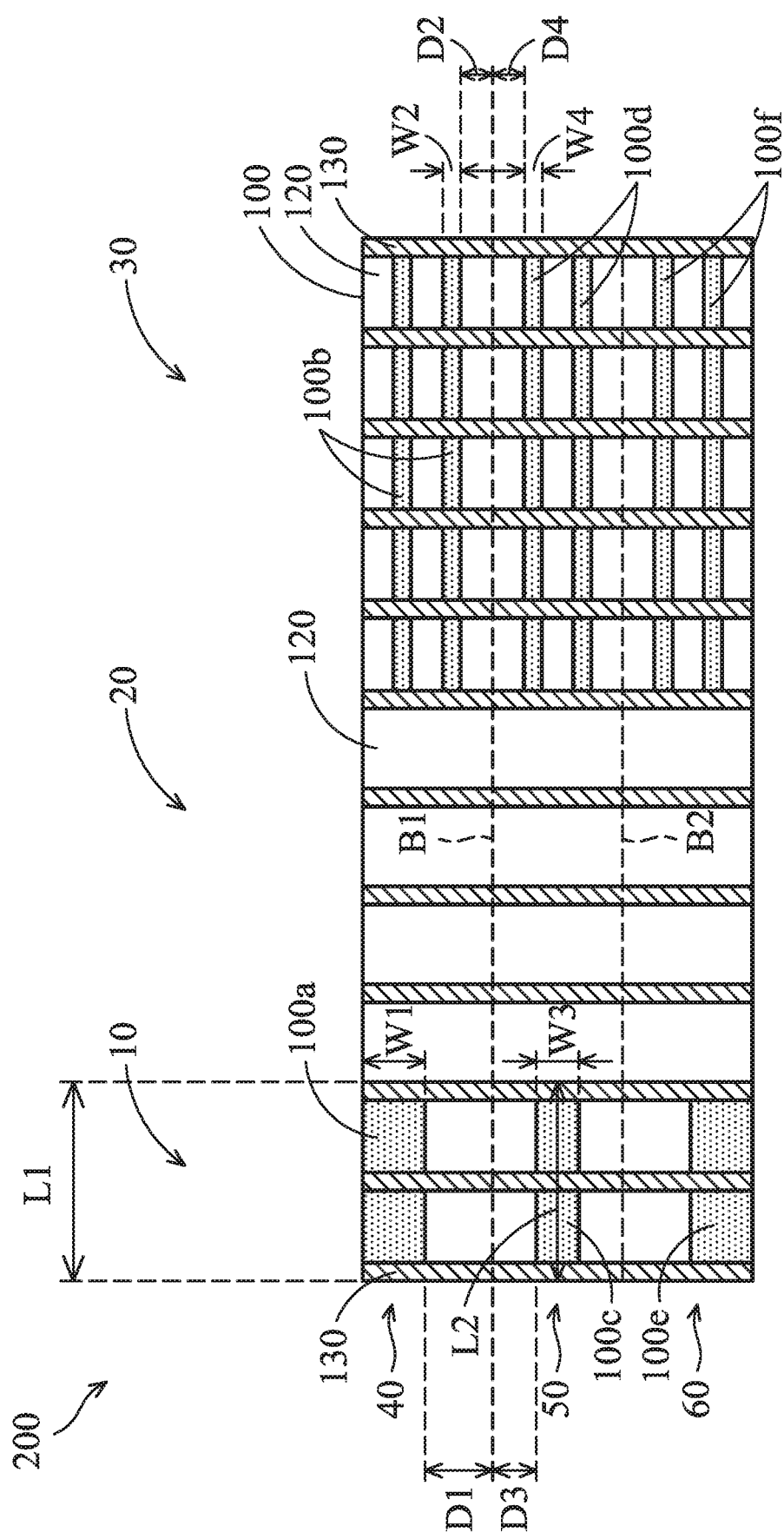
FIG. 1 is schematic top view showing a semiconductor device with fin structures in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a semiconductor device structure and a method for forming a semiconductor device structure are provided. FIG. 1 is schematic top view showing a semiconductor device 200 with fin structures in accordance with some embodiments. As shown in FIG. 1, the semiconductor device 200 includes a semiconductor substrate 100 having a well pick-up region 10, an active region 30, and a dummy region 20. In some embodiments, the dummy region 20 is between the well pick-up region 10 and the active region 30. In some embodiments, the well pick-up region 10 includes a first well region 40 having a first conductivity type, a second well region 50 having an opposite second conductivity type adjacent to the first well region 40, and a third well region 60 having the first conductivity type adjacent to the second well region 50. That is, the first well region 40 and the third well region are doped with a first type of dopants. The second well region 50 is doped with an opposite second type of dopants. Moreover, the dummy region 20 and the active region 30 also include the first well region 40, the second well region 50 adjacent to the first well region 40, and the third well region 60 adjacent to the second well region 50, respectively. As a result, the second well region 50 is between the first well region 40 and third well region 60, so that a first well boundary B1 is defined between the first well region 40 and the second well region 50 and a second boundary B2 is defined between the second well region 50 and the third well region 60. In some embodiments, the first and third well regions 40 and 60 (e.g., PMOS regions) are used for P-type FinFETs formed thereon and the second well region 50 (e.g., an NMOS region) is used for N-type FinFETs formed thereon. Alternatively, the first and third well regions 40 and 60 (e.g., NMOS regions) are used for N-type FinFETs formed thereon and the second well region 50 (e.g., a PMOS region) is used for P-type FinFETs formed thereon.

In some embodiments, the semiconductor substrate 100 includes a semiconductor material (e.g., silicon). In some other embodiments, the semiconductor substrate 100 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or a combination thereof. Alternatively, the semiconductor substrate 100 is a semiconductor on insulator (SOI).

In some embodiments, the semiconductor device 200 further includes a first fin structure 100a protruding from the semiconductor substrate 100 in the first well region 40 of the well pick-up region 10. Moreover, one or more second fin structures 100b protrude from the semiconductor substrate 100 in the first well region 40 of the active region 30 and extend into the first well region 40 of the dummy region 20.

In some embodiments, the first fin structure 100a is spaced apart from the first well boundary B1 by a first distance D1. Moreover, one of the second fin structures 100b that is closest to the first well boundary B1 is also spaced apart from the first well boundary B1 by a second distance D2. The first distance D1 may be a minimum distance between the first well boundary B1 and the first fin structure 100a. For example, the first distance D1 is a distance between a sidewall of the first fin structure 100a and the first well boundary B1. Similarly, the second distance D2 may be a minimum distance between the first well boundary B1 and the second fin structure 100b that is closest to the first well boundary B1. For example, the second distance D2 is a distance between a sidewall of the second fin structure 100b and the first well boundary B1. In some embodiments, the ratio of the first distance D1 to the second distance D2 is in a range from about 2 to about 3.5. In some embodiments, the first distance D1 is in a range from about 50 nm to about 70 nm. The second distance D2 is in a range from about 20 nm to about 25 nm. In some embodiments, the first distance D1 is greater than the second distance D2. The sufficient difference between the first distance D1 and the second distance D2 is designed to prevent an interdiffusion region (or referred to as a depletion region that is caused by doping the first well region 40 and the second well region 50 with different types of dopants) (not shown) in the first well region 40 from extending into the first fin structure 100a. As a result, the resistance of the first fin structure 100a can be prevented from being increased. Moreover, the sufficient utilized area of the semiconductor substrate 100 for forming the first fin structure 100a can be obtained, thereby preventing the resistance of the first fin structure 100a from being increased. In some embodiments, the first distance D1 is not less than the maximum length of the interdiffusion region in the first well region 40.

In some embodiments, the first fin structure 100a has a first fin width W1 and each of the second fin structures 100b has a second fin width W2. In some embodiments, the ratio of the first fin width W1 to the second fin width W2 is in a range from about 2.5 to about 20. In some embodiments, the first fin width W1 is in a range from about 25 nm to about 100 nm. The second fin width W2 is in a range from about 5 nm to about 10 nm.

In some embodiments, the second fin width W2 is less than the first fin width W1. Since the interdiffusion region in the first well region 40 may extend into the first fin structure 100a, the sufficient difference between the first fin width W1 and the second fin width W2 is designed to prevent the dopant depletion or dopant lost (which is caused by the interdiffusion region) in the first fin structure 100a from being greatly increased. As a result, the resistance of the first fin structure 100a can be prevented from being increased.

In some embodiments, the semiconductor device 200 further includes a third fin structure 100c protruding from the semiconductor substrate 100 in the second well region 50 of the well pick-up region 10. Moreover, one or more fourth fin structures 100d protrude from the semiconductor substrate 100 in the second well region 50 of the active region 30 and extend into the second well region 50 of the dummy region 20.

In some embodiments, the third fin structure 100c is spaced apart from the first well boundary B1 by a third distance D3. Moreover, one of the fourth fin structures 100d that is closest to the first well boundary B1 is also spaced apart from the first well boundary B1 by a fourth distance D4. The third distance D3 may be a minimum distance between the first well boundary B1 and the third fin structure 100c. For example, the third distance D3 is a distance between a sidewall of the third fin structure 100c and the first well boundary B1. Similarly, the fourth distance D4 may be a minimum distance between the first well boundary B1 and the fourth fin structure 100d that is closest to the first well boundary B1. For example, the fourth distance D4 is a distance between a sidewall of the fourth fin structures 100d and the first well boundary B1. In some embodiments, the ratio of the third distance D3 to the fourth distance D4 is in a range from about 1 to about 2. In some embodiments, the third distance D3 is in a range from about 30 nm to about 40 nm. The fourth distance D4 is in a range from about 20 nm to about 30 nm. In some embodiments, the third distance D3 is greater than the fourth distance D4. Similarly, the sufficient difference between the third distance D3 and the fourth distance D4 is designed to prevent an interdiffusion region (which is caused by doping the first well region 40 and the second well region 50 with different types of dopants) (not shown) in the second well region 50 from extending into the third fin structure 100c. As a result, the resistance of the third fin structure 100c can be prevented from being increased. Moreover, the sufficient utilized area of the semiconductor substrate 100 for forming the third fin structure 100c can be obtained, thereby preventing the resistance of the third fin structure 100c from being increased. In some embodiments, the third distance D3 is not less than the maximum length of the interdiffusion region in the second well region 50. In some embodiments, the first distance D1 is different from or substantially equal to the third distance D3. For example, the first distance D1 is greater than the third distance D3, as shown in FIG. 1.

In some embodiments, the third fin structure 100c has a third fin width W3 and each of the fourth fin structures 100d has a fourth fin width W4. In some embodiments, the ratio of the third fin width W3 to the fourth fin width W4 is in a range from about 1.5 to about 10. In some embodiments, the third fin width W3 is in a range from about 12 nm to about 50 nm. The fourth fin width W4 is in a range from about 5 nm to about 8 nm. In some embodiments, the fourth fin width W4 is less than the third fin width W3. Similarly, since the interdiffusion region in the second well region 50 may extend into the third fin structure 100c, the sufficient difference between the third fin width W3 and the fourth fin width W4 is designed to prevent the dopant depletion or dopant lost (which is caused by the interdiffusion region) in the third fin structure 100c from being greatly increased. As a result, the resistance of the third fin structure 100c can be prevented from being increased. In some embodiments, the first fin width W1 is different from or substantially equal to the third fin width W3.

In some embodiments, the first fin structure 100a has a first fin length L1 and the third fin structure 100c has a second fin length L2 that is substantially equal to the first fin length L1. As a result, two ends of the first fin structure 100a are respectively aligned to two corresponding ends of the third fin structure 100c, as shown in FIG. 1. In some embodiments, the first fin length L1 is in a range from about 50 nm to about 150 nm and the second fin length L2 is in a range from about 50 nm to about 150 nm.

In some embodiments, the semiconductor device 200 further includes a fifth fin structure 100e protruding from the semiconductor substrate 100 in the third well region 60 of the well pick-up region 10. Moreover, one or more sixth fin structures 100f protrude from the semiconductor substrate 100 in the third well region 60 of the active region 30 and extend into the third well region 60 of the dummy region 20.

In some embodiments, the fifth fin structure 100e is spaced apart from the second well boundary B2. Moreover, one of the sixth fin structures 100f that is closest to the second well boundary B2 is also spaced apart from the second well boundary B2. The minimum distance (which is referred to as a fifth distance) between the second well boundary B2 and the fifth fin structure 100e may be greater than the minimum distance (which is referred to as a sixth distance) between the second well boundary B2 and one of the sixth fin structures 100f that is closest to the second well boundary B2. The fifth distance may be a distance between a sidewall of the fifth fin structure 100e and the second well boundary B2. The sixth distance may be a distance between the second well boundary B2 and a sidewall of the sixth fin structure 100f that is closest to the second well boundary B2. In some embodiments, the ratio of the fifth distance to the sixth distance is the same as or similar to the ratio of the first distance D1 to the second distance D2. Moreover, the fifth distance is the same as or similar to the first distance D1. The sixth distance is the same as or similar to the second distance D2. Similarly, the sufficient difference between the fifth distance and the sixth distance is designed to prevent an interdiffusion region (which is caused by doping the second well region 50 and the third well region 60 with different types of dopants) (not shown) in the third well region 60 from extending into the fifth fin structure 100e. As a result, the resistance of the fifth fin structure 100e can be prevented from being increased. Moreover, the sufficient utilized area of the semiconductor substrate 100 for forming the fifth fin structure 100e can be obtained, thereby preventing the resistance of the fifth fin structure 100e from being increased. In some embodiments, the fifth distance is not less than the maximum length of an interdiffusion region (not shown) in the third well region 60 caused by doping the second well region 50 and the third well region 60 with different types of dopants.

In some embodiments, the third fin structure 100c is spaced apart from the second well boundary B2 by a distance that is the same or different from the third distance D3. Moreover, one of the fourth fin structures 100d that is closest to the second well boundary B2 is also spaced apart from the second well boundary B2 by a distance that is the same or different from the fourth distance D4. In some embodiments, the minimum distance between the second well boundary B2 and the third fin structure 100c is not less than the maximum length of an interdiffusion region (not shown) in the second well region 50 caused by doping the second well region 50 and the third well region 60 with different types of dopants.

Moreover, the minimum distance between the second well boundary B2 and the fifth fin structure 100e is different from or substantially equal to the minimum distance between the second well boundary B2 and the third fin structure 100c. For example, the minimum distance between the second well boundary B2 and the fifth fin structure 100e is greater than the minimum distance between the second well boundary B2 and the third fin structure 100c, as shown in FIG. 1.

In some embodiments, the fifth fin structure 100e may have a fin width that is different from a fin width of each of the sixth fin structures 100f. For an example, the fin width of the fifth fin structure 100e is the same as or similar to the first fin width W1 and the fin width of the sixth fin structure 100f is the same as or similar to the second fin width W2 or the fourth fin width W4. In this case, the fin width of the sixth fin structure 100f is less than the fin width of the fifth fin structure 100e. In some embodiments, the fin width of the fifth fin structure 100e is different from or substantially equal to the third fin width W3 of the third fin structure 100c. Similarly, since the interdiffusion region in the third well region 60 may extend into the fifth fin structure 100e, the sufficient difference between the fifth fin structure 100e and sixth fin structure 100f is designed to prevent the dopant depletion or dopant lost (which is caused by the interdiffusion region) in the fifth fin structure 100e from being greatly increased. As a result, the resistance of the fifth fin structure 100e can be prevented from being increased.

In some embodiments, the fifth fin structure 100e has a fin length substantially equal to the first fin length L1 of the first fin structure 100a and the second fin length L2 of the third fin structure 100c. As a result, two ends of the fifth fin structure 100e are respectively aligned to two corresponding ends of the first fin structure 100a and two corresponding ends of the third fin structure 100c.

In some embodiments, the semiconductor device 200 further includes isolation structures may be positioned on opposite sides of the fin structures (e.g., the first, second, third, fourth, fifth, and six fin structures 100a, 100b, 100c, 100d, 100e, and 100f). In some embodiments, each of the isolation structures includes an isolation feature 120 and a liner structure (not shown) covering the sidewall and the bottom of the isolation feature 120. As a result, the semiconductor substrate 100 and the lower portion of the fin structures (e.g., the first, second, third, fourth, fifth, and six fin structures 100a, 100b, 100c, 100d, 100e, and 100f) are spaced apart from the isolation features 120 by the liner structures.

In some embodiments, the isolation feature 120 is made of a dielectric material, such as silicon oxide, fluoride-doped silicate glass (FSG), a low-k dielectric material, and/or another suitable insulating material. The isolation features 120 may be shallow trench isolation (STI) features. In some embodiments, the liner structure may include a single layer or a multiple structure and may be made of silicon oxide, silicon nitride, silicon oxynitride, silicon carbide (SiC), or a combination thereof.

In some embodiments, a distance between the sidewall of the first fin structure 100a and the sidewall of the third fin structure 100c is greater than a distance between the sidewall of the second fin structure 100b and the sidewall of the fourth fin structure 100d. In some embodiments, the first fin structure 100a and the third fin structure 100c are separated by one of the isolation structures. In those cases, this isolation structure may be in direct contact with both the sidewall of the first fin structure 100a and the sidewall of the third fin structure 100c. Similarly, in some embodiments, a distance between the sidewall of the fifth fin structure 100e and the sidewall of the third fin structure 100c is greater than a distance between the sidewall of the sixth fin structure 100f and the sidewall of the fourth fin structure 100d. In some embodiments, the fifth fin structure 100f and the third fin structure 100c are separated by one of the isolation structures. In those cases, this isolation structure may be in direct contact with both the sidewall of the fifth fin structure 100f and the sidewall of the third fin structure 100c In some embodiments, the semiconductor device 200 further includes gate structures 130 are positioned over the semiconductor substrate 100. Some of those gate structures 130 are across the first, third, and the fifth fin structures 100a, 100c, and 100e in the pick-up region 10. Moreover, the other gate structures 130 are across the second, fourth, and sixth fin structures 100b, 100d, and 100f in the dummy region 50 and the second, fourth, and sixth fin structures 100b, 100d, and 100f in the active region 60.

In some embodiments, each of the gate structures 130 may include a gate dielectric layer, a gate electrode layer, and/or one or more additional layers. In some embodiments, the gate structure 130 is a sacrificial gate structure or a dummy gate structure such as formed in a replacement gate process used to form a metal gate structure. In some embodiments, the gate structure 130 includes polysilicon layer (as the gate electrode layer). Moreover, the gate dielectric layer of the gate structure 130 may include silicon dioxide or another suitable dielectric material. Alternatively, the gate dielectric layer of the gate structure 130 may include a high-k dielectric layer such as $HfO_2$, $TiO_2$, $HfZrO$, $Ta_2O_3$, $HfSiO_4$, $ZrO_2$, $ZrSiO_2$, or a combination thereof.

In some embodiments, the gate structure 130 may be a metal gate structure. The metal gate structure may include an interfacial layer, a gate dielectric layer, work function layer(s), and a fill metal layer. In some embodiments, the interfacial layer may include a dielectric material such as silicon oxide layer ($SiO_2$) or silicon oxynitride (SiON). Moreover, an exemplary p-type work function metal may include TiN, TaN, Ru, Mo, Al, WN, $ZrSi_2$, $MoSi_2$, $TaSi_2$, $NiSi_2$, WN, or a combination thereof. An exemplary n-type work function metal may include Ti, Ag, TaAl, TaAlC, TiAlN, TaC, TaCN, TaSiN, Mn, Zr, or a combination thereof.

FIGS. 2A to 2F are schematic top view showing various stages of a method of forming the semiconductor device 200 shown in FIG. 1, in accordance with some embodiments. FIGS. 3A to 3F are cross-sectional views along line A-A' of FIGS. 2A to 2F to show various stages of a process for forming the semiconductor device 200, in accordance with some embodiments. FIGS. 4A to 4F are cross-sectional views along line B-B' of FIGS. 2A to 2F to show various stages of a process for forming the semiconductor device 200, in accordance with some embodiment.

Figure 2A:
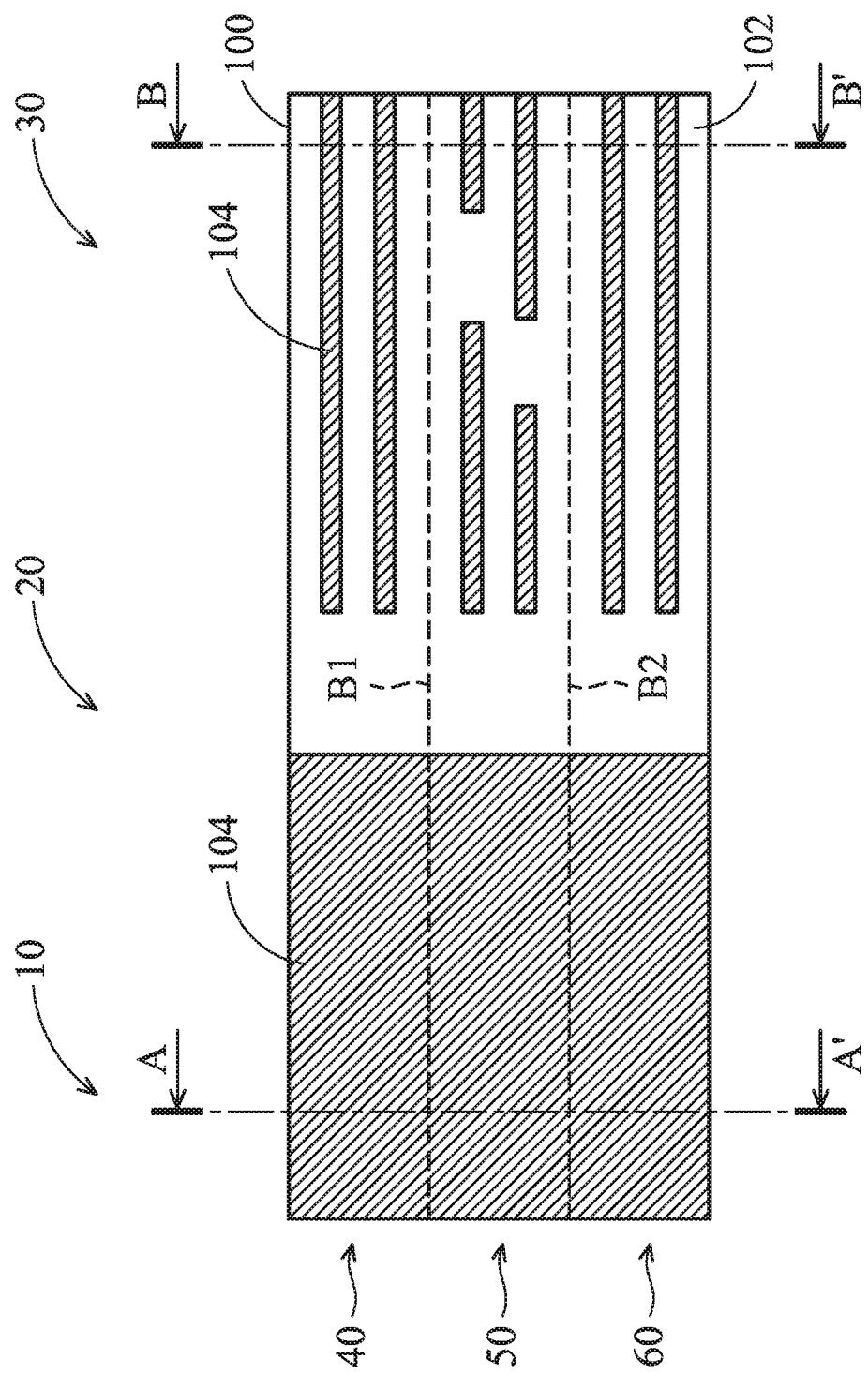
FIGS. 2A to 2F are schematic top view showing various stages of a method of forming a semiconductor device with fin structures in accordance with some embodiments.
Figure 3A:
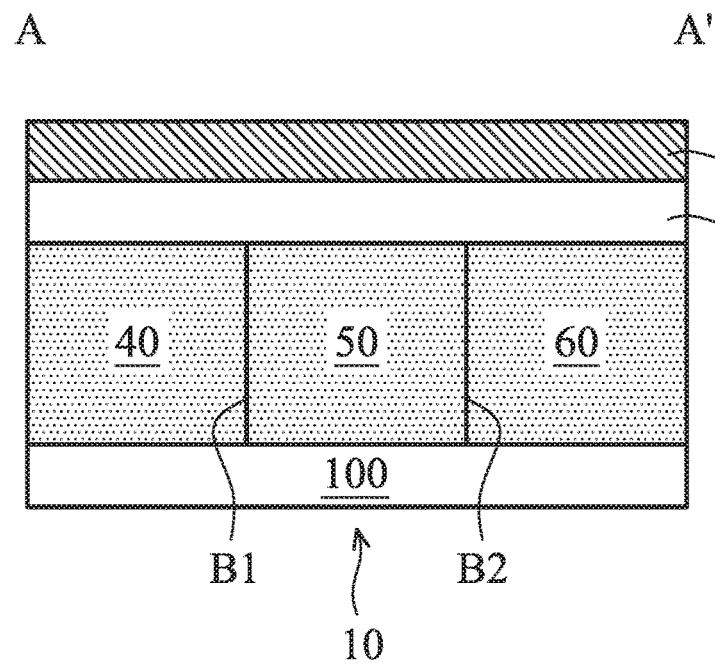
FIGS. 3A to 3F are schematic cross-sectional views showing various stages of the method of forming the semiconductor device with fin structures taken along the line A-A' in FIGS. 2A to 2F.
Figure 4A:
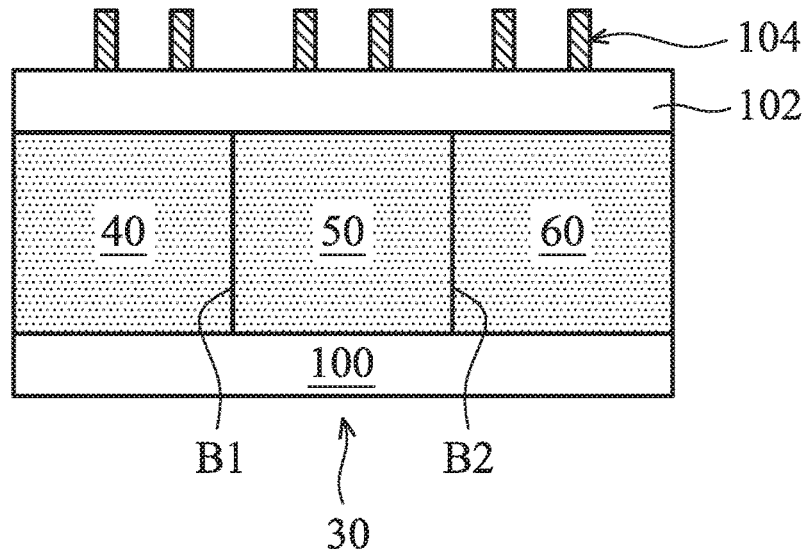
FIGS. 4A to 4F are schematic cross-sectional views showing various stages of the method of forming the semiconductor device with fin structures taken along the line B-B' in FIGS. 2A to 2F.

As shown in FIGS. 2A, 3A, and 4A, a semiconductor substrate 100 is received. In some embodiments, the semiconductor substrate 100 includes a semiconductor material (e.g., silicon). In some other embodiments, the semiconductor substrate 100 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or a combination thereof. Alternatively, the semiconductor substrate 100 is a semiconductor on insulator (SOI).

In some embodiments, the semiconductor substrate 100 has a well pick-up region 10, an active region 30, and a dummy region 20 between the well pick-up region 10 and the active region 30. In some embodiments, the semiconductor substrate 100 may be doped (e.g. with a P-type dopant and/or an N-type dopant) or undoped. For example, the semiconductor substrate 100 is doped with P-type and N-type dopants by well implantation processes. Each of the well pick-up region 10, the dummy region 20, and the active region 30 includes a first well region 40, a second well region 50, and a third well region 60. Moreover, the first well region 40 and the third well region 60 are doped with a first type of dopants, so that the first well region 40 and the third well region 60 have a first conductivity type. The second well region 50 is doped with an opposite second type of dopants, so that the second well region 50 has an opposite second conductivity type adjacent to the first well region 40 and the third well region 60. Therefore, the second well region 50 is between the first well region 40 and third well region 60. A first well boundary B1 is between the first well region 40 and the second well region 50. Moreover, a second boundary B2 is between the second well region 50 and the third well region 60. For an example, the first and third well regions 40 and 60 (e.g., PMOS regions) are used for P-type FinFETs formed thereon. Moreover, the second region 50 (e.g., an NMOS region) is used for N-type FinFETs formed thereon.

In some embodiments, in a P-well implantation process for the first and third well regions 40 and 60, P-type dopants are implanted at an energy level in a range from about 20K eV to about 40K eV. Moreover, the dopant concentration of the P-type dopants is in a range from about 1×10$^{13}$ atoms/cm$^3$ to about 7×10$^{13}$ atoms/cm$^3$. In some embodiments, N-type dopants are implanted at an energy level in a range from about 80K eV to about 120K eV. Moreover, the dopant concentration of the N-type dopants is in a range from about 1×10$^{13}$ atoms/cm3 to about 6×10$^{13}$ atoms/cm$^3$, in some embodiments.

In some embodiments, the semiconductor substrate 100 has a first region 100a and a second region 100b adjacent to the first region 100a. The first region 100a may be employed to form P-type devices, such as P-type metal-oxide-semiconductor field-effect transistors (MOSFETs). In those cases, the second region 100b may be employed to form N-type devices, such as N-type MOSFETs. Therefore, the first region 100a may be referred to as a PMOS region, and the second region 100b may be referred to as an NMOS region. In some other embodiments, P-type devices (or N-type devices) are formed in both the first region 100a and the second region 100b.

In some embodiments, a first photoresist (not shown) may be formed over the semiconductor substrate 100 to expose regions where the first and third well regions 40 and 60 to be formed. Afterwards, a P-well implantation process may be performed on the exposed regions of the semiconductor substrate 100, so as to form the first and third well regions 40 and 60. Similarly, after removal of the first photoresist, a second photoresist (not shown) is formed over the semiconductor substrate 100 to expose a region where the second well region 50 to be formed. Afterwards, an N-well implantation process is performed on the exposed region of the semiconductor substrate 100 to form the second well region 50. In some embodiments, the first and third well regions 40 and 60 may be doped with boron (B) ions to form the P-wells. Moreover, the second well region 50 is doped with arsenic (As) or phosphorous (P) ions to form the N-well.

Afterwards, a first masking layer 102 and an overlying second masking layer 104 are successively formed over the semiconductor substrate 100 for formation of fin structures in subsequent processes. The first masking layer 102 may be a buffer layer between semiconductor substrate 100 and the second masking layer 104. In some embodiments, the first masking layer 102 is formed of silicon oxide. In some embodiments, the second masking layer 104 is made of SiN or SiON. In some embodiments, the first masking layer 102 and the overlying second masking layer 104 are formed by a respective deposition process. For example, the deposition process for formation of the first masking layer 102 may be a thermal oxidation process. Moreover, the deposition process for formation of the second masking layer 104 may be a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, a sputtering process, or another applicable process.

The second masking layer 104 is patterned by patterning a photoresist layer (not shown) with photolithography and then etching the un-protected second masking layer 104 with an etching process (such as a wet etching process or a dry etching process), as shown in FIGS. 2A, 3A, and 4A. The photolithography process includes photoresist coating (e.g., spin-on coating), soft baking, mask aligning, exposure, post-exposure baking, developing the photoresist, rinsing and drying (e.g., hard baking). In some embodiments, after the etching process is performed, the patterned second masking layer 104 include fin patterns corresponding to the active region 30 and those fin patterns extend from the active region 30 into the dummy region 20.

Figure 2B:
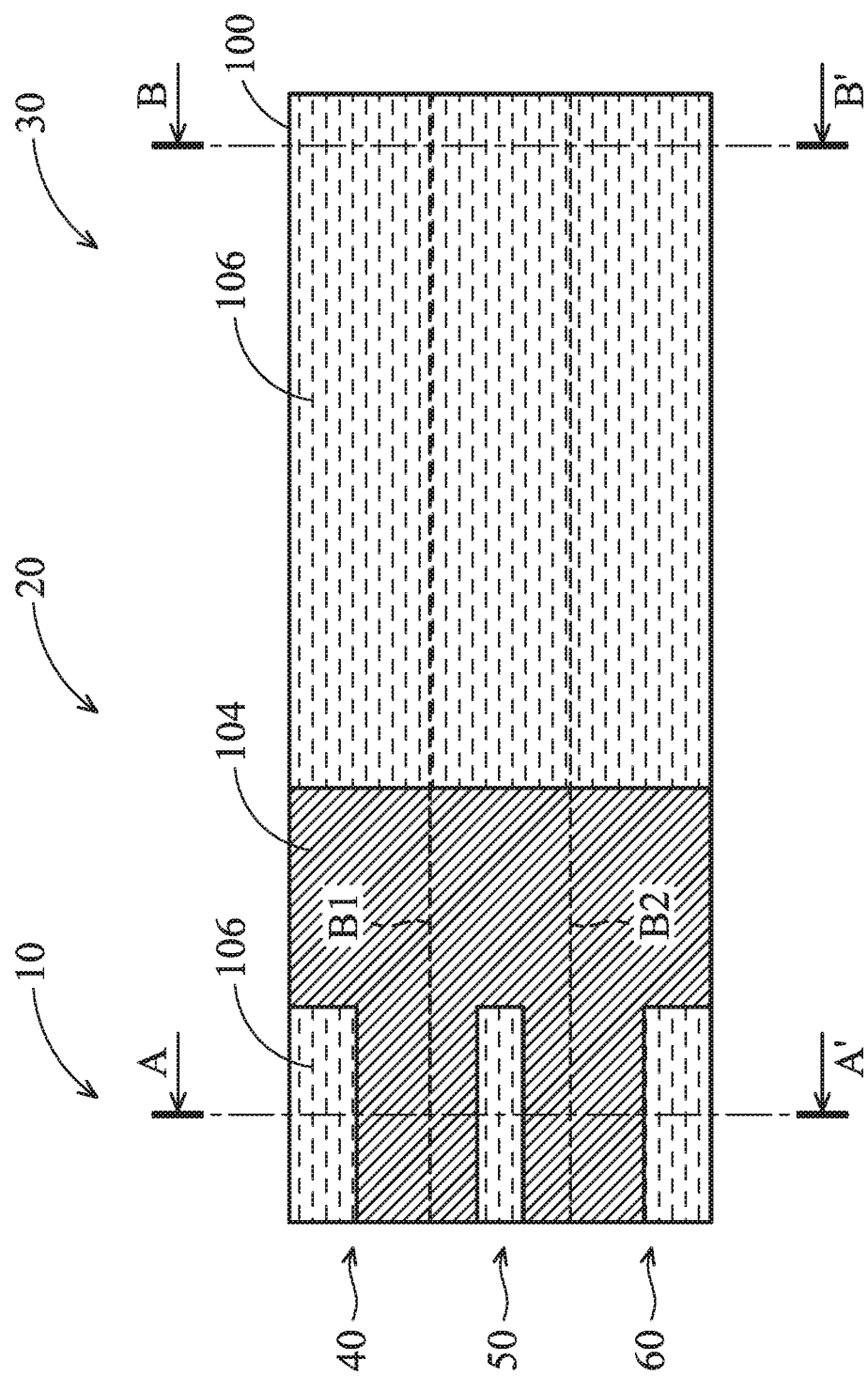
Figure 3B:
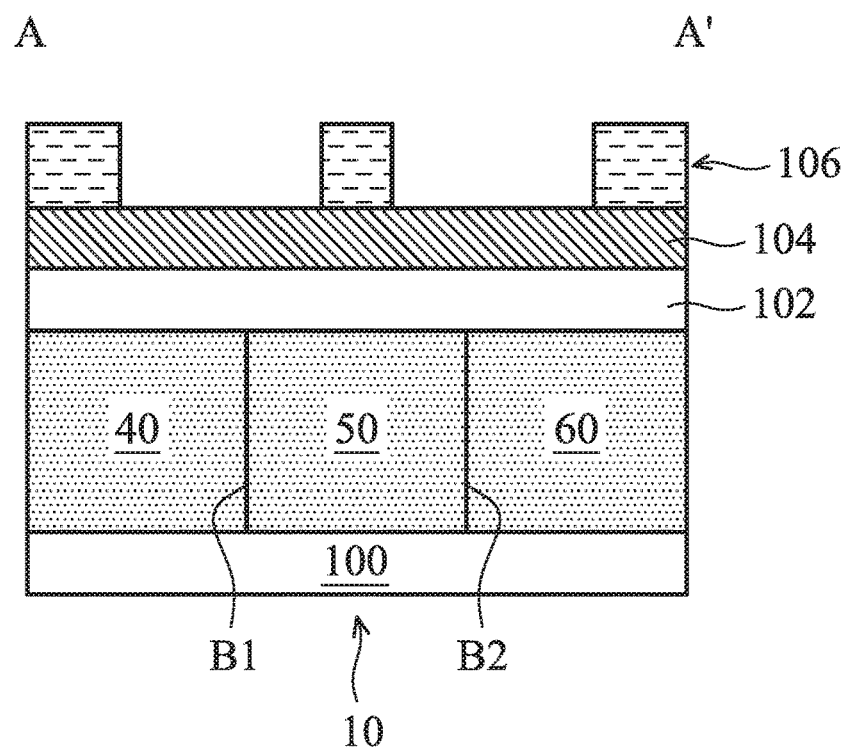
Figure 4B:
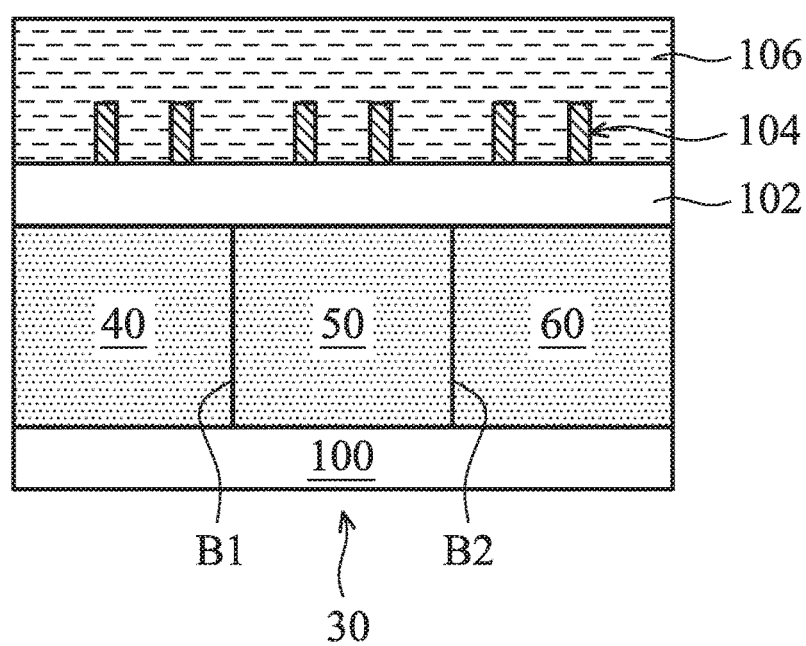

As shown in FIGS. 2B, 3B, and 4B, a third masking layer 106 is formed to cover the structure shown in FIGS. 2A, 3A, and 4A, in some embodiments. In some embodiments, the third masking layer 106 is made of photoresist or another suitable masking material. For example, the third masking layer 106 is made of photoresist and is patterned by a photolithography process. In some embodiments, after the photolithography process is performed, the patterned third masking layer 106 includes fin patterns corresponding to the pick-up well region 10. In some embodiments, the fin patterns of the third masking layer 106 shown in FIG. 2B have a different width than that of the fin patterns of the second masking layer 104 shown in FIG. 2A. Moreover, the minimum distances between the fin patterns of the third masking layer 106 shown in FIG. 2B are also different from those between the fin patterns of the second masking layer 104 shown in FIG. 2A. For example, the fin patterns of the third masking layer 106 shown in FIG. 2B have a width greater than that of the fin patterns of the second masking layer 104 shown in FIG. 2A. Moreover, the minimum distances between the fin patterns of the third masking layer 106 shown in FIG. 2B are also greater than those between the fin patterns of the second masking layer 104 shown in FIG. 2A.

Figure 2C:
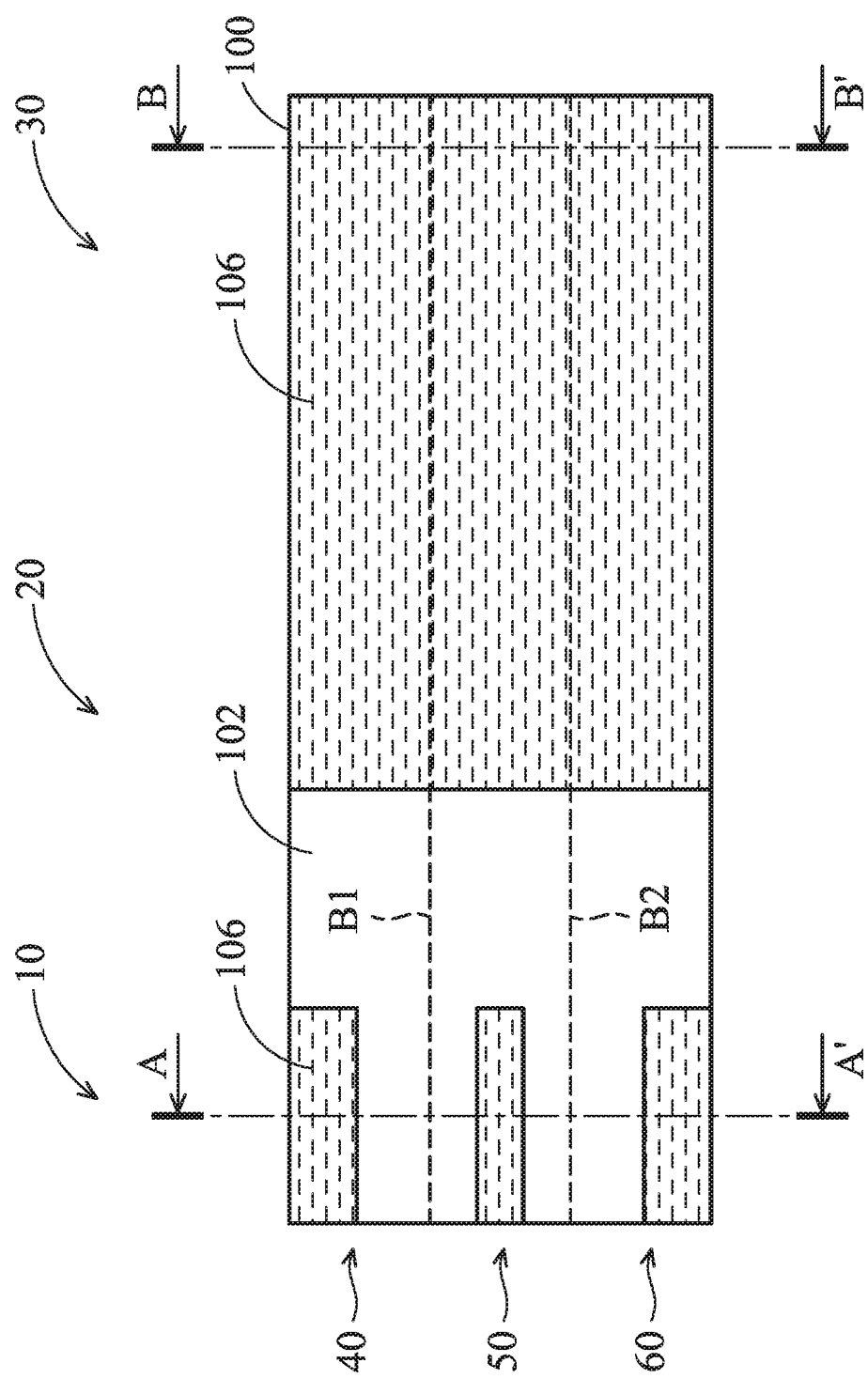
Figure 3C:
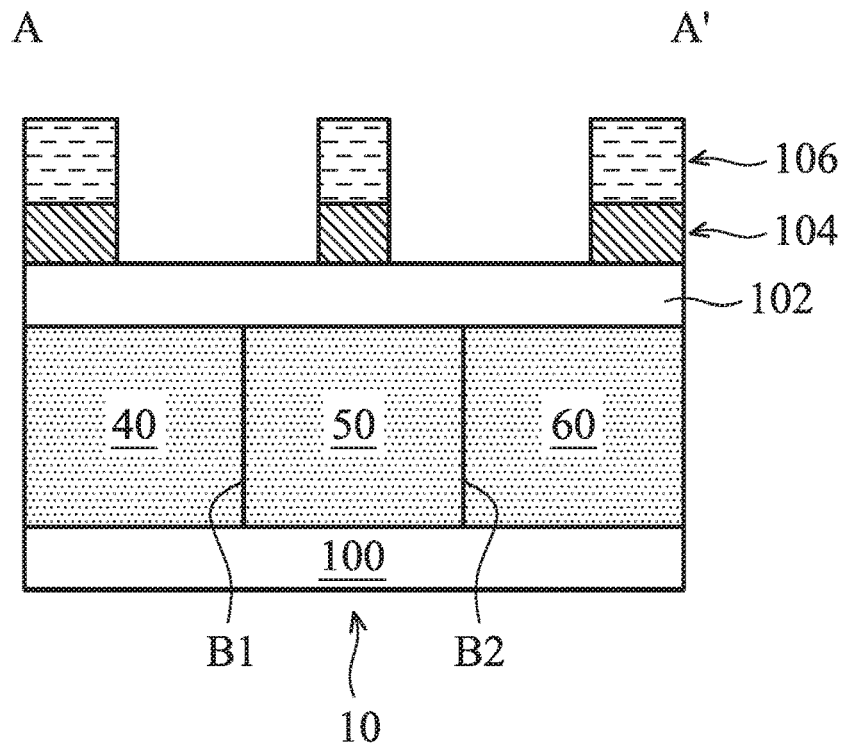
Figure 4C:
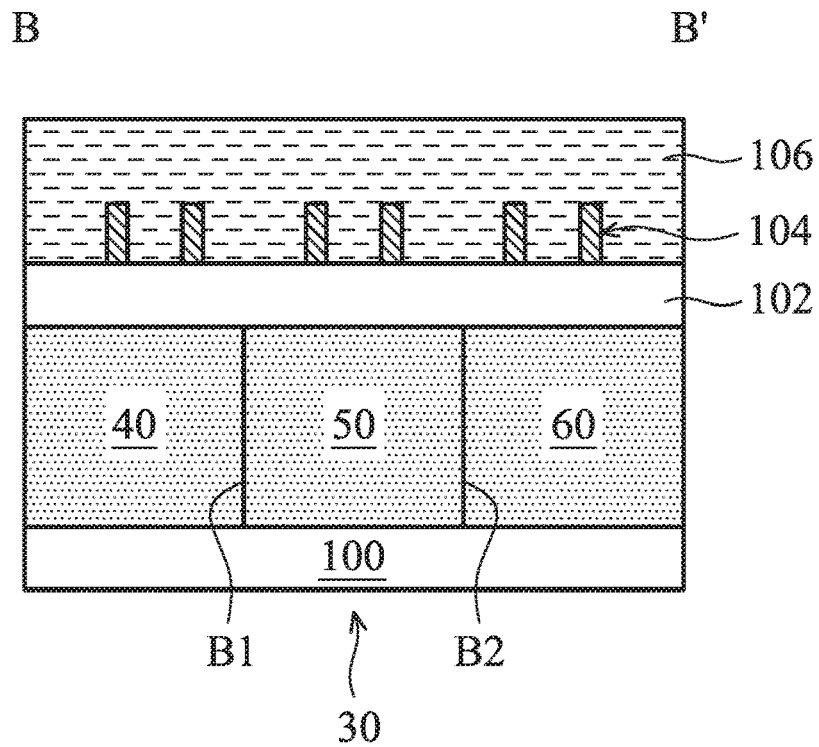

As shown in FIGS. 2C, 3C, and 4C, after the third masking layer 106 is patterned, an etching process (such as a wet etching process or a dry etching process) is performed to remove the second masking layer 104 not covered by the patterned third masking layer 106. As a result, the fin patterns of the third masking layer 106 are transferred into the second masking layer 104. After the etching process is performed, the patterned second masking layer 104 includes fin patterns corresponding to the well pick-up region 10, the dummy region 20, and the active region 30. Those fin patterns have different widths and different fin-to-fin spaces (i.e., the minimum distance between the fin structures).

After forming the fin patterns in the second masking layer 104 and corresponding to the well pick-up region 10, the dummy region 20, and the active region 30, the third masking layer 106 may be removed by a suitable removal process, such as etching or plasma ashing, in accordance with some embodiments.

Figure 2D:
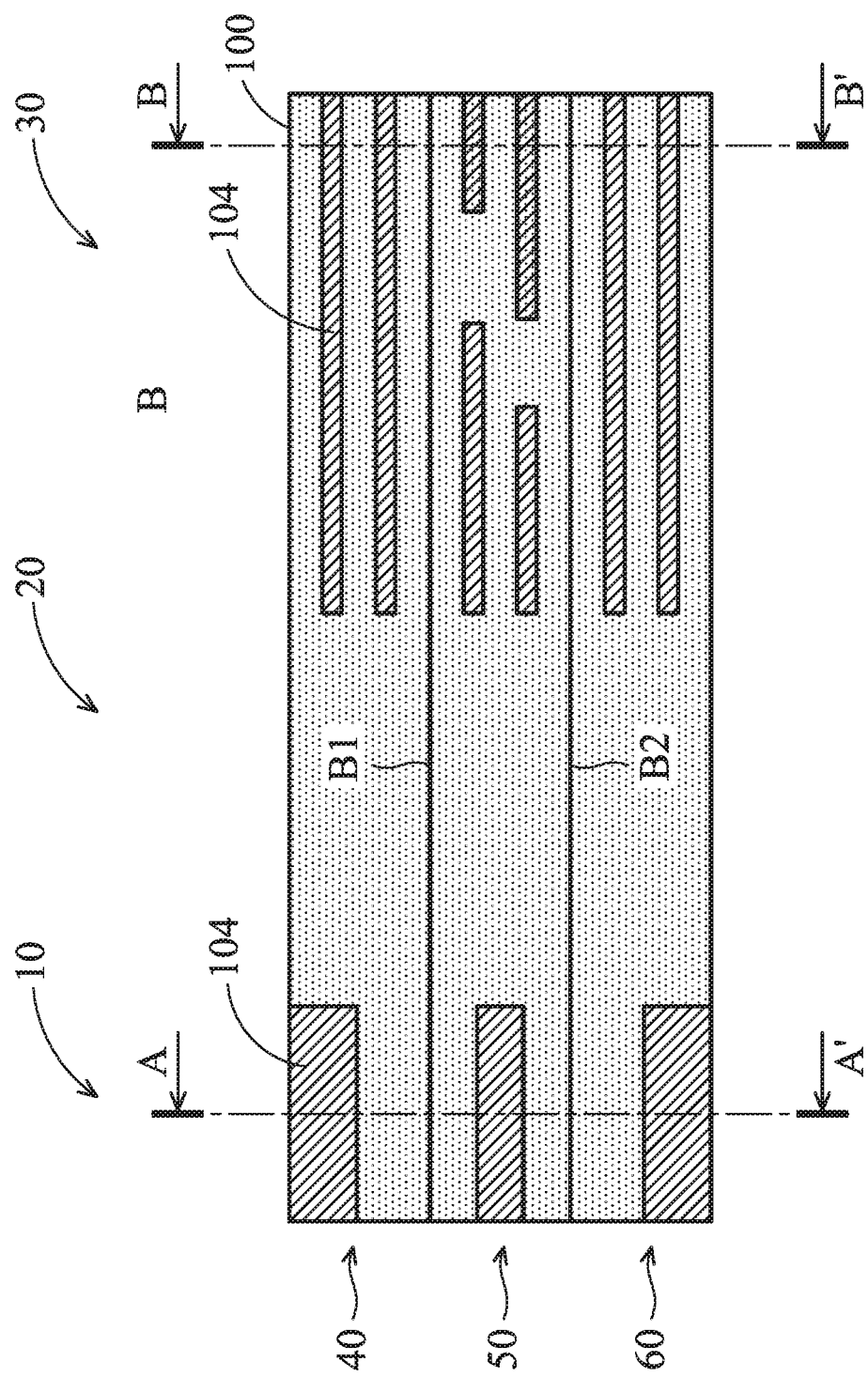
Figure 3D:
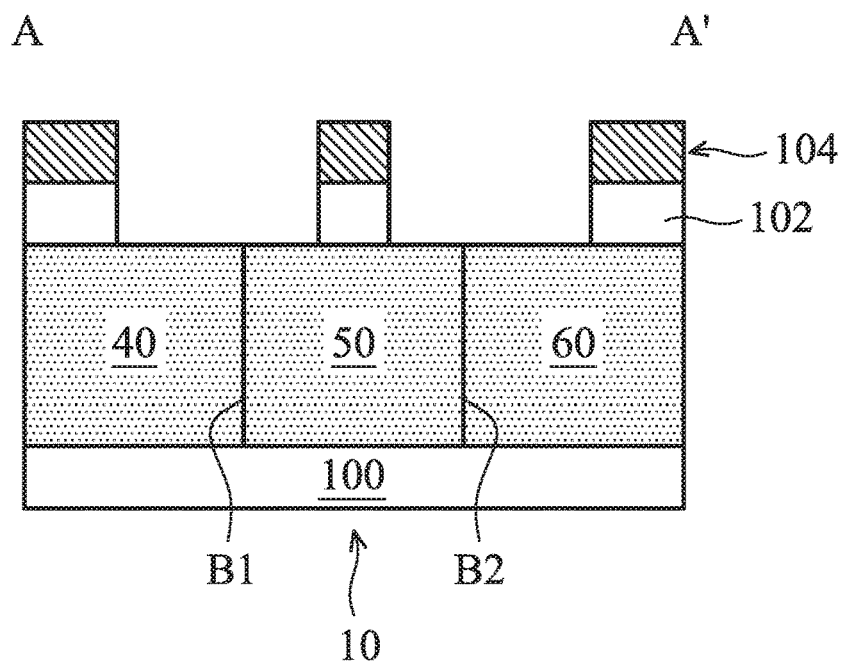
Figure 4D:
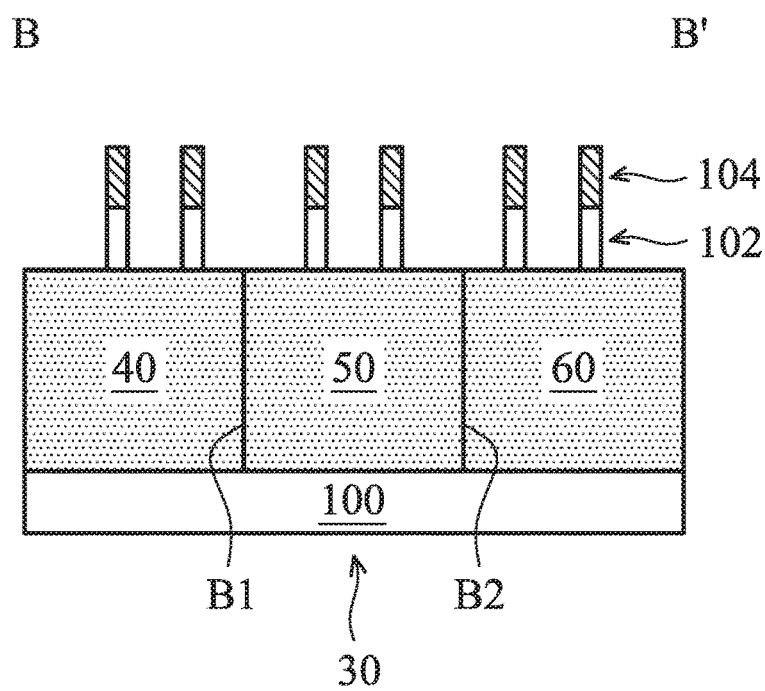

Afterwards, an etching process (such as a wet etching process or a dry etching process) is performed to remove the first masking layer 102 not covered by the patterned second masking layer 104. Therefore, the fin patterns of the second masking layer 104 are transferred into the first masking layer 102. After the etching process is performed, the patterned first masking layer 102 includes fin patterns corresponding to the well pick-up region 10, the dummy region 20, and the active region 30. Those fin patterns have different widths and different fin-to-fin spaces (i.e., the minimum distance between the fin structures), as shown in FIGS. 2D, 3D, and 4D.

Figure 2E:
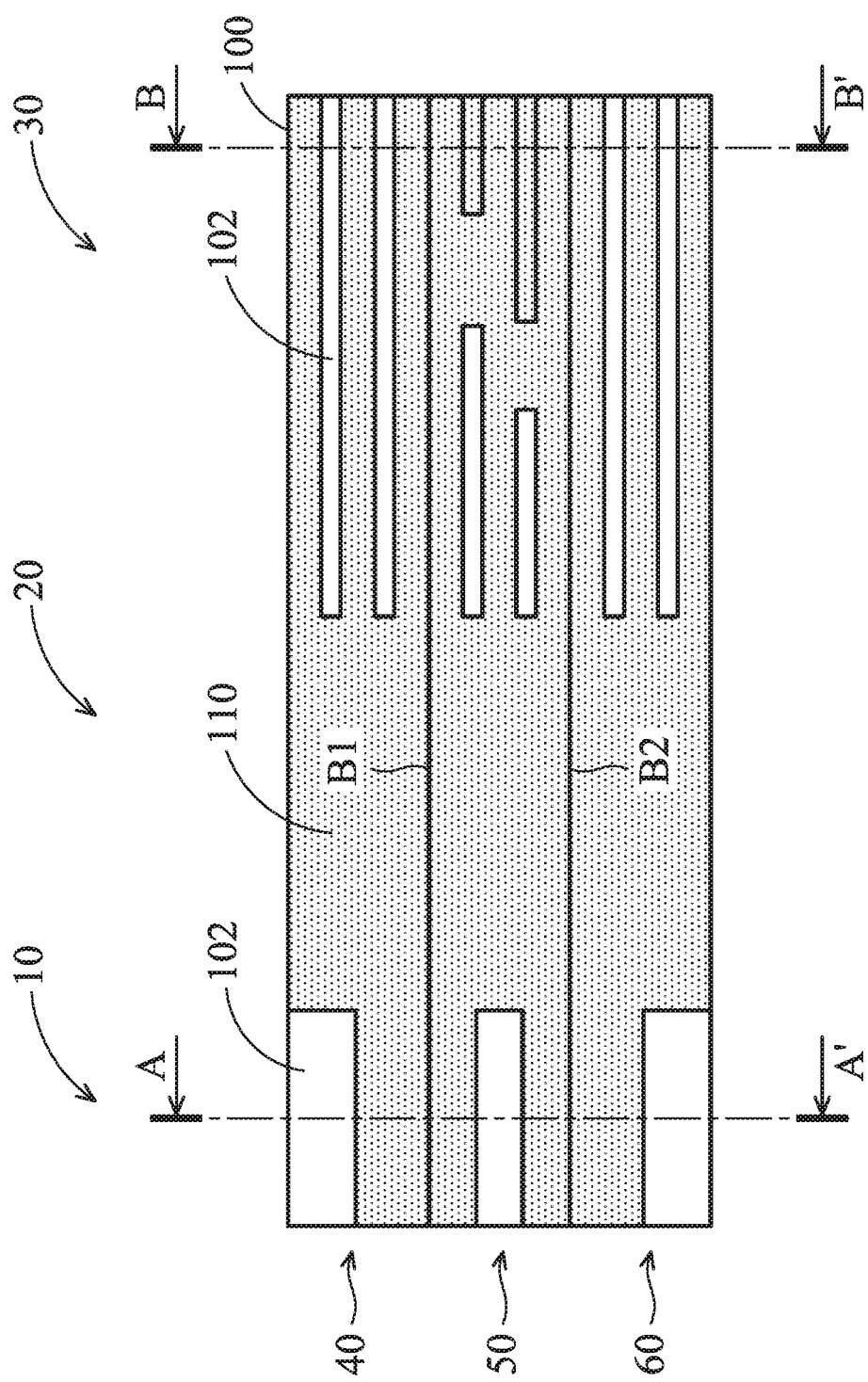
Figure 3E:
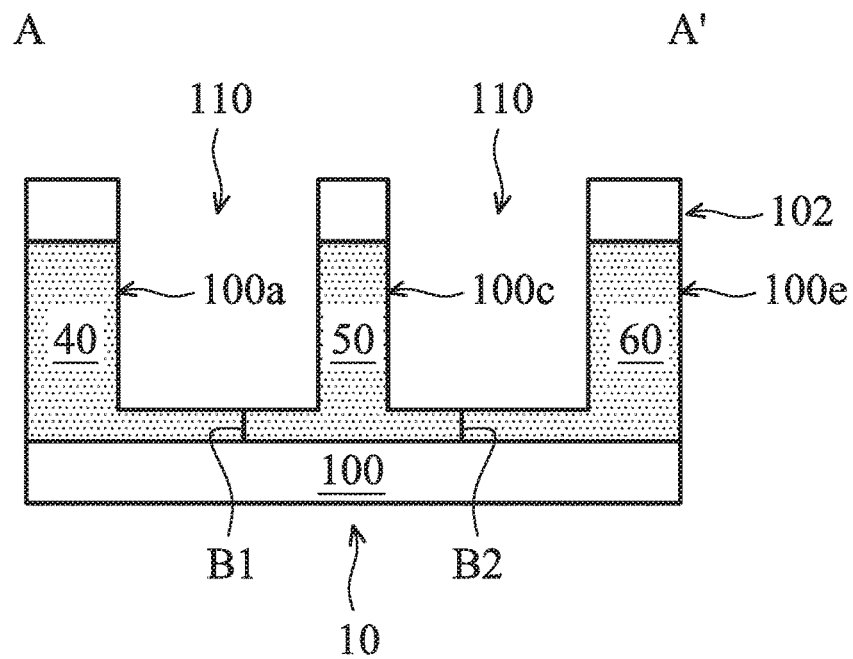
Figure 4E:
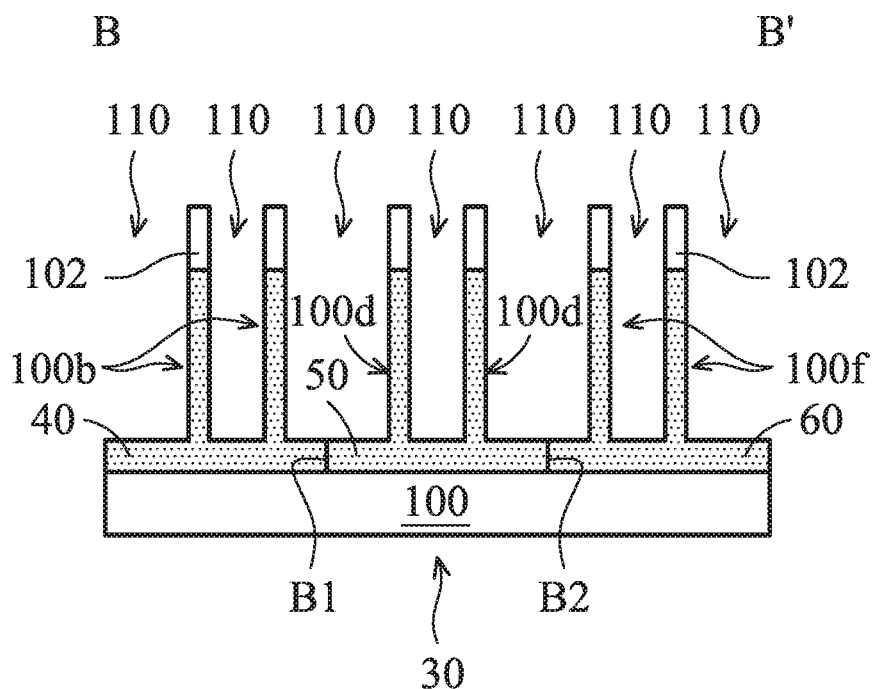

As shown in FIGS. 2E, 3E, and 4E, an etching process (such as a dry or wet etching process) is performed on the semiconductor substrate 100 exposed from the patterned first masking layer 102 and the overlying and patterned second masking layer 104, in accordance with some embodiments. As a result, a first fin structure 100a, second fin structures 100b, a third fin structure 100c, fourth fin structures 100d, a fifth fin structure 100e, and sixth fin structures 100f, and trenches 110 are formed. During the etching process, the patterned second masking layer 104 may be entirely removed, as shown in FIGS. 2E, 3E, and 4E.

Figure 2F:
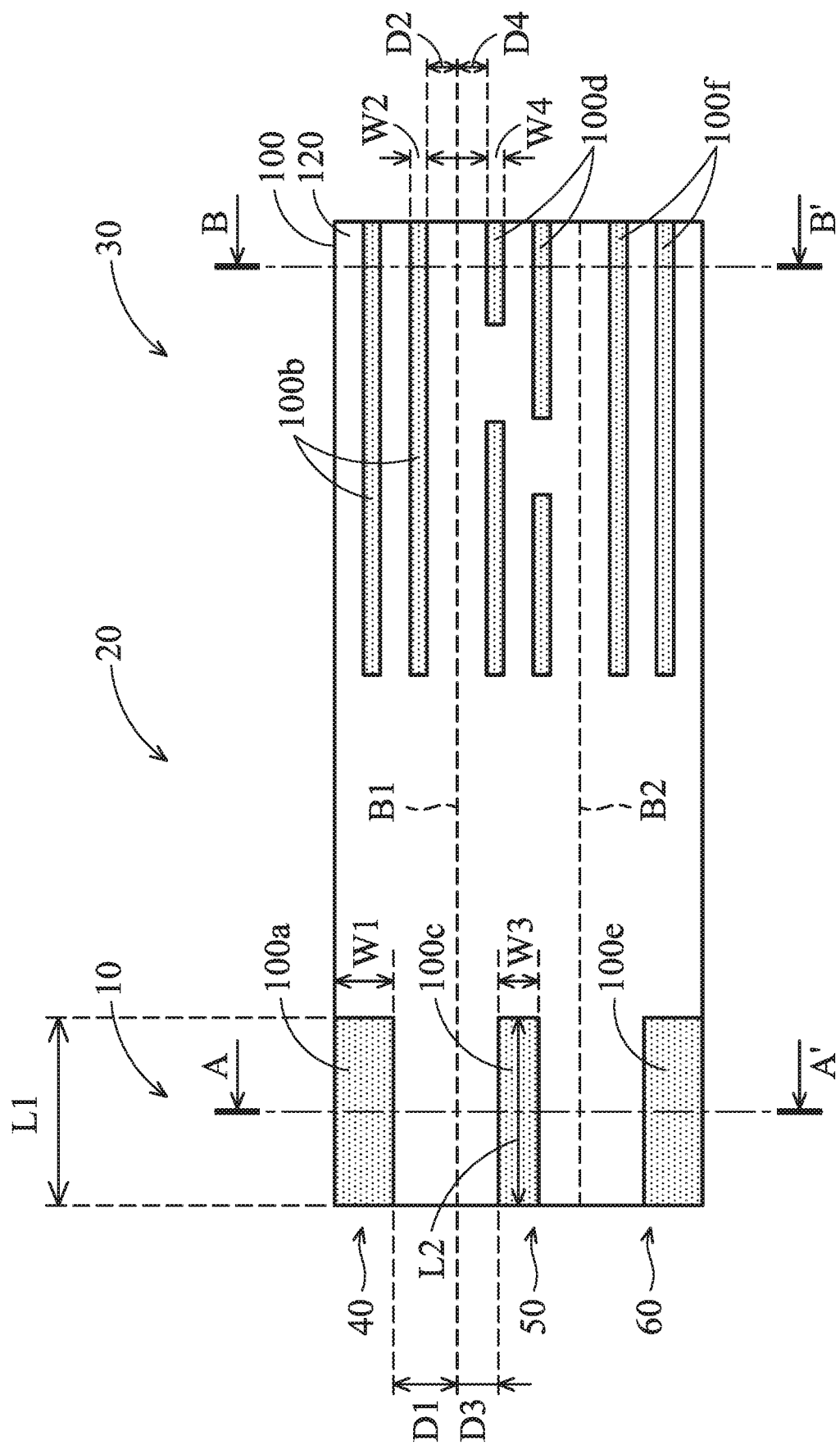
Figure 3F:
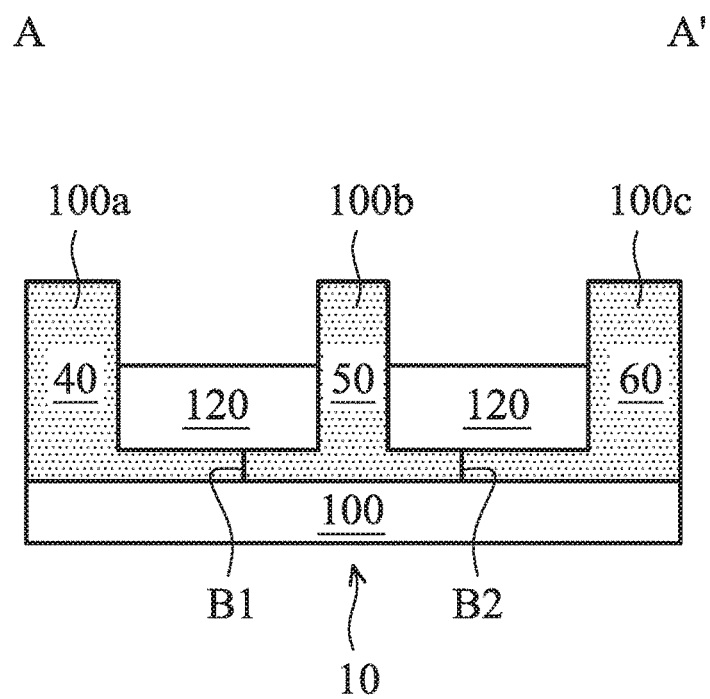
Figure 4F:
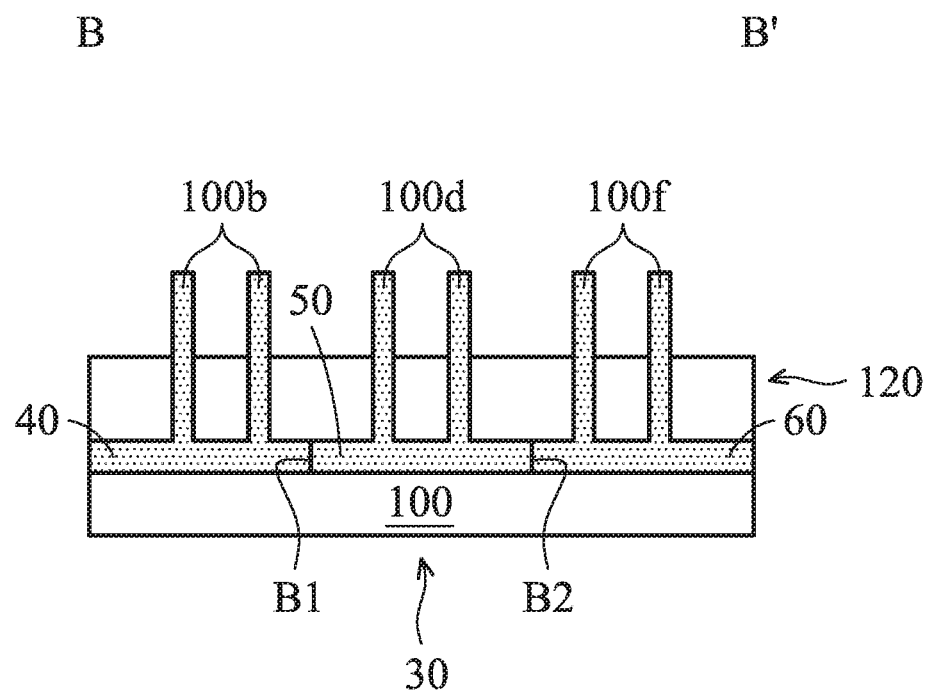

Afterwards, the patterned first masking layer 102 may be removed by a suitable removal process, such as etching or plasma ashing, as shown in FIGS. 2F, 3F, and 4F in accordance with some embodiments. As shown in FIG. 2F, the first fin structure 100a is formed in the first well region 40 of the well pick-up region 10. The second fin structures 100b are formed in the first well region 40 of the active region 30 and extend into the first well region 40 of the dummy region 20. The third fin structure 100c is formed in the second well region 50 of the well pick-up region 10. The fourth fin structures 100d are formed in the second well region 50 of the active region 30 and extend into the second well region 50 of the dummy region 20. The fifth fin structure 100e is formed in the third well region 60 of the well pick-up region 10. The sixth fin structures 100f are formed in the third well region 60 of the active region 30 and extend into the third well region 60 of the dummy region 20.

In some embodiments, a first distance D1 (i.e., the minimum distance between the first well boundary B1 and the first fin structure 100a) is different from a second distance D2 (i.e., the minimum distance between the first well boundary B1 and one of the second fin structures 100b that is closest to the first well boundary B1). For example, the first distance D1 is greater than the second distance D2. In some embodiments, the first distance D1 is not less than the maximum length of an interdiffusion region (not shown) in the first well region 40 caused by doping the first well region 40 and the second well region 50 with different types of dopants. In some embodiments, the first fin structure 100a has a first fin width W1 and each of the second fin structures 100b has a second fin width W2 that is different from the first fin width W1. For example, the second fin width W2 is less than the first fin width W1.

In some embodiments, a third distance D3 (i.e., the minimum distance between the first well boundary B1 and the third fin structure 100c) is different from a fourth distance D4 (i.e., the minimum distance between the first well boundary B1 and one of the fourth fin structures 100d that is closest to the first well boundary B1). For example, the third distance D3 is greater than the fourth distance D4. In some embodiments, the third distance D3 is also not less than the maximum length of an interdiffusion region (not shown) in the second well region 50 caused by doping the first well region 40 and the second well region 50 with different types of dopants. In some embodiments, the first distance D1 is different from or substantially equal to the third distance D3.

In some embodiments, the third fin structure 100c has a third fin width W3 and each of the fourth fin structures 100d has a fourth fin width W4 that is different from the third fin width W3. For example, the fourth fin width W4 is less than the third fin width W3. In some embodiments, the first fin width W1 is different from or substantially equal to the third fin width W3. Moreover, the second fin width W2 is different from or substantially equal to the fourth fin width W4.

In some embodiments, the first fin structure 100a has a first fin length L1 and the third fin structure 100c has a second fin length L2 that is substantially equal to the first fin length L1. As a result, two ends of the first fin structure 100a are respectively aligned to two corresponding ends of the third fin structure 100c.

In some embodiments, the minimum distance between the second well boundary B2 and the fifth fin structure 100e may be different from the minimum distance between the second well boundary B2 and one of the sixth fin structures 100f that is closest to the second well boundary B2. For example, the minimum distance between the second well boundary B2 and the fifth fin structure 100e is greater than the minimum distance between the second well boundary B2 and one of the sixth fin structures 100f. In some embodiments, the minimum distance between the second well boundary B2 and the fifth fin structure 100e is not less than the maximum length of an interdiffusion region (not shown) in the third well region 60 caused by doping the second well region 50 and the third well region 60 with different types of dopants.

In some embodiments, the minimum distance between the second well boundary B2 and the third fin structure 100c is different from the minimum distance between the second well boundary B2 and one of the fourth fin structures 100d that is closest to the second well boundary B2. For example, the minimum distance between the second well boundary B2 and the third fin structure 100c is greater than the minimum distance between the second well boundary B2 and one of the fourth fin structures 100d that is closest to the second well boundary B2. In some embodiments, the minimum distance between the second well boundary B2 and the third fin structure 100c is not less than the maximum length of an interdiffusion region (not shown) in the second well region 50 caused by doping the second well region 50 and the third well region 60 with different types of dopants.

Moreover, the minimum distance between the second well boundary B2 and the fifth fin structure 100e is different from or substantially equal to the minimum distance between the second well boundary B2 and the third fin structure 100c. For example, the minimum distance between the second well boundary B2 and the fifth fin structure 100e is greater than the minimum distance between the second well boundary B2 and the third fin structure 100c.

In some embodiments, the fifth fin structure 100e may have a fin width that is different from a fin width of each of the sixth fin structures 100f. For example, the fin width of the sixth fin structure 100f is less than the fin width of the fifth fin structure 100e. In some embodiments, the fin width of the fifth fin structure 100e is different from or substantially equal to the third fin width W3 of the third fin structure 100c.

In some embodiments, the fifth fin structure 100e has a fin length substantially equal to the second fin length L2 of the third fin structure 100c. As a result, two ends of the fifth fin structure 100e are respectively aligned to two corresponding ends of the third fin structure 100c.

After the first fin structure 100a, the second fin structures 100b, the third fin structure 100c, the fourth fin structures 100d, the fifth fin structure 100e, and the sixth fin structures 100f are formed, a liner structure (not shown) is conformally formed over the sidewall and the bottom of each trench 110 and covers the fin structures 100a to 100f. The liner structure may serve as a shallow trench isolation (STI) liner and a protective layer for the fin structures 100a to 100f. In some embodiments, the liner structure includes a single layer or a multiple structure. For example, the liner structure includes a single layer and is made of silicon oxide ($SiO_2$), silicon carbide (SiC), silicon nitride (SiN or $Si_3N_4$), silicon oxynitride (SiON), or another suitable dielectric material. In some embodiments, the liner structure is formed by a thermal oxidation process or a deposition process including CVD, physical vapor deposition (PVD), atomic layer deposition (ALD), or the like. An optional rapid thermal treatment may be performed on the liner structure to improve the film quality.

After the liner structure is formed, an insulating layer (not shown) is formed to cover the fin structures 100a to 100f and also fills the trenches 110 that are covered by the liner structure, in accordance with some embodiments. The insulating layer may be formed of silicon oxide, silicon nitride, low-k dielectric materials, or a combination thereof, and may be formed by a flowable CVD (FCVD) process. Other insulating materials and/or other formation processes may be used.

After the insulating layer is formed, an anneal process may be performed to cure the insulating layer, in accordance with some embodiments. The anneal process may include a wet steam anneal, and a subsequent dry anneal process.

Afterwards, the insulating layer and the liner structure over the top surfaces of the fin structures 100a to 100f are removed by a planarization process. The planarization process may be a chemical mechanical polish (CMP) process. Afterwards, a portion of the insulating layer and a portion of the liner structure are removed to expose the upper portions of the fin structures 100a, 100c and 100e, as shown in FIG. 3F, in accordance with some embodiments. Also, the upper portions of the fin structures 100b, 100d and 100f, as shown in FIG. 4F. As a result, isolation features 120 are formed. In some embodiments, the insulating layer and the liner structure are removed by an etching process such as a dry etching process or a wet etching process, so as to form isolation structures such as shallow trench isolation (STI) structures, as shown in FIGS. 2F, 3F, and 4F, in accordance with some embodiments. In some embodiments, the etching process includes a dry etching process using an etching gas comprising ammonia (e.g. $NH_3$) and hydrogen fluoride (HF).

Afterwards, gate structures 130 are formed over the fin structures 100a to 100f to form the semiconductor device 200, as shown in FIG. 1, in accordance with some embodiments. In some embodiments, some of those gate structures 130 are across the first, third, and the fifth fin structures 100a, 100c, and 100e in the pick-up region 10 and the other gate structures 130 are across the second, fourth, and sixth fin structures 100b, 100d, and 100f in the dummy region 50 and the second, fourth, and sixth fin structures 100b, 100d, and 100f in the active region 60.

In some embodiments, each of the gate structures 130 may include a gate dielectric layer, a gate electrode layer, and/or one or more additional layers. In some embodiments, the gate structure 130 is a dummy gate structure. In those cases, the gate structure 130 includes polysilicon layer (as the dummy gate electrode layer). Moreover, the dummy gate dielectric layer of the gate structure 130 may include silicon dioxide or another suitable dielectric material. Alternatively, the dummy gate dielectric layer of the gate structure 130 may include a high-k dielectric layer such as $HfO_2$, $TiO_2$, $HfZrO$, $Ta_2O_3$, $HfSiO_4$, $ZrO_2$, $ZrSiO_2$, or a combination thereof. The dummy gate dielectric layer may be formed by a deposition process, such as CVD, PVD, ALD, high density plasma CVD (HDPCVD), metal organic CVD (MOCVD), or plasma enhanced CVD (PECVD). Moreover, the dummy gate electrode layer is formed by a deposition process, such as CVD, PVD, ALD, HDPCVD, MOCVD, or PECVD.

In some embodiments, the gate structure 130 may be a metal gate structure. The metal gate structure may include an interfacial layer, a gate dielectric layer, work function layer(s), and a fill metal layer. In some embodiments, the interfacial layer may include a dielectric material such as silicon oxide layer ($SiO_2$) or silicon oxynitride (SiON). Moreover, an exemplary p-type work function metal may include TiN, TaN, Ru, Mo, Al, WN, $ZrSi_2$, $MoSi_2$, $TaSi_2$, $NiSi_2$, WN, or a combination thereof. An exemplary n-type work function metal may include Ti, Ag, TaAl, TaAlC, TiAlN, TaC, TaCN, TaSiN, Mn, Zr, or a combination thereof.

Afterwards, in some embodiments, a gate-last process (sometimes referred to as a replacement gate process) is performed. In the gate-last process, the dummy gate structures are removed to form recesses. Afterwards, in some embodiments, a metal gate structure is formed in each recess.

In some embodiments, the gate dielectric layer of the metal gate structure includes silicon oxide, silicon nitride, or a high-k dielectric material including a metal oxide or a silicate of Hf, Al, Zr, La, Mg, Ba, Ti, Pb, or a combination thereof. The formation methods of gate dielectric layer may include CVD, ALD, PECVD, and the like.

In some embodiments, the gate electrode layer of the metal gate structure may be made of a metal-containing material such as TiN, TaN, TaC, Co, Ru, Al, combinations thereof, or multi-layers thereof, and may be formed by, e.g., electroplating, electroless plating, or another suitable method.

Figure 5:
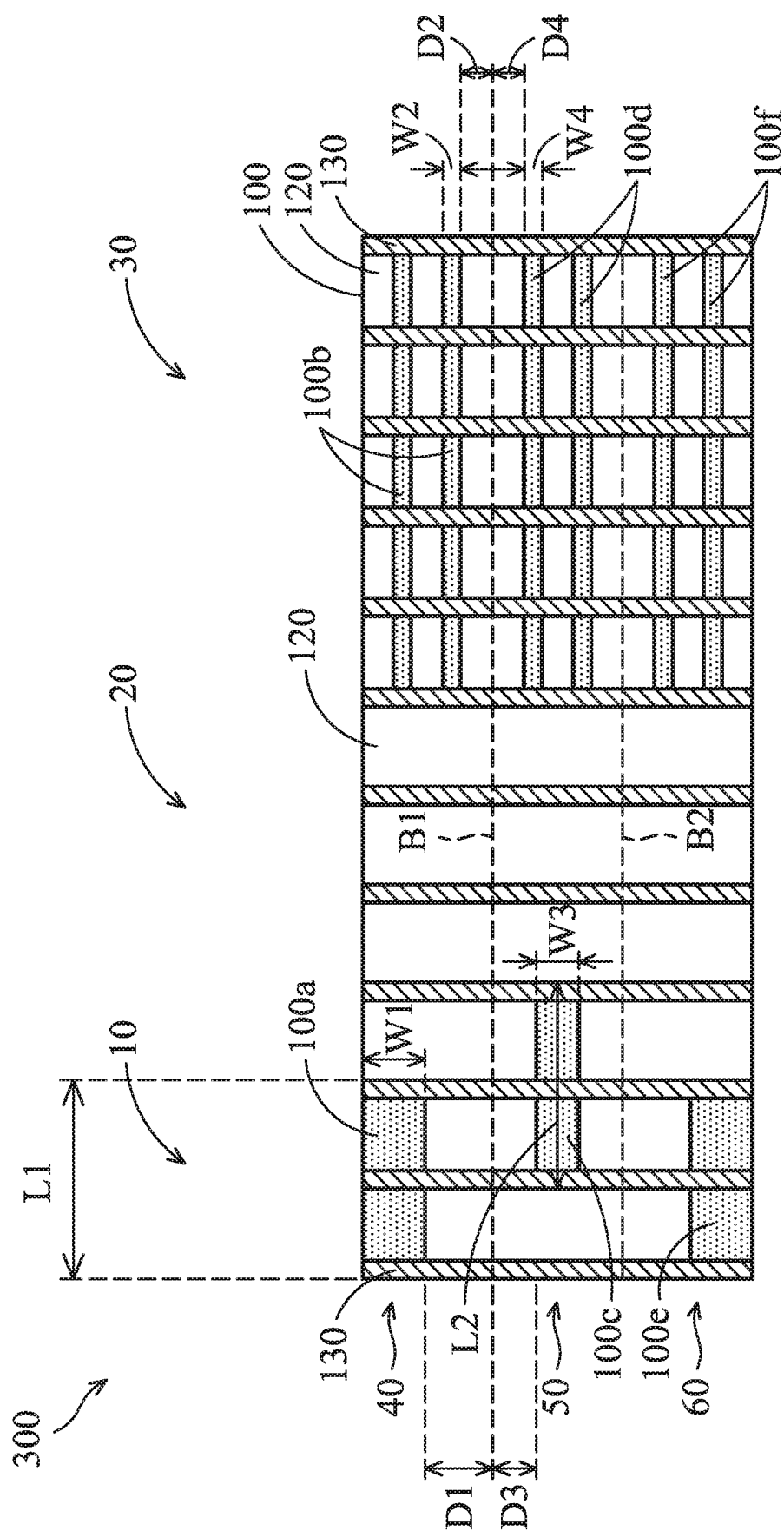
FIG. 5 is schematic top view showing a semiconductor device with fin structures in accordance with some embodiments.

FIG. 5 is schematic top view showing a semiconductor device 300 with fin structures in accordance with some embodiments. Elements in FIG. 5 that are the same as those in FIG. 1 are labeled with the same reference numbers as in FIG. 1 and are not described again for brevity. In some embodiments, the semiconductor device 300 is similar to the semiconductor device 200 shown in FIG. 1. The difference is two ends of the first fin structure 100a are not aligned to the corresponding ends of the third fin structure 100c or the corresponding ends of the fifth fin structure 100e. For an example, two ends of the first fin structure 100a are not aligned to the corresponding ends of the third fin structure 100c. Moreover, those ends of the first fin structure 100a are still aligned to the corresponding ends of the fifth fin structure 100e. That is, two ends of the third fin structure 100c are not aligned to the corresponding ends of the fifth fin structure 100e. In some embodiments, the semiconductor device 300 may be fabricated by the same or similar method shown in FIGS. 2A to 2F, 3A to 3F, and 4A to 4F.

Figure 6:
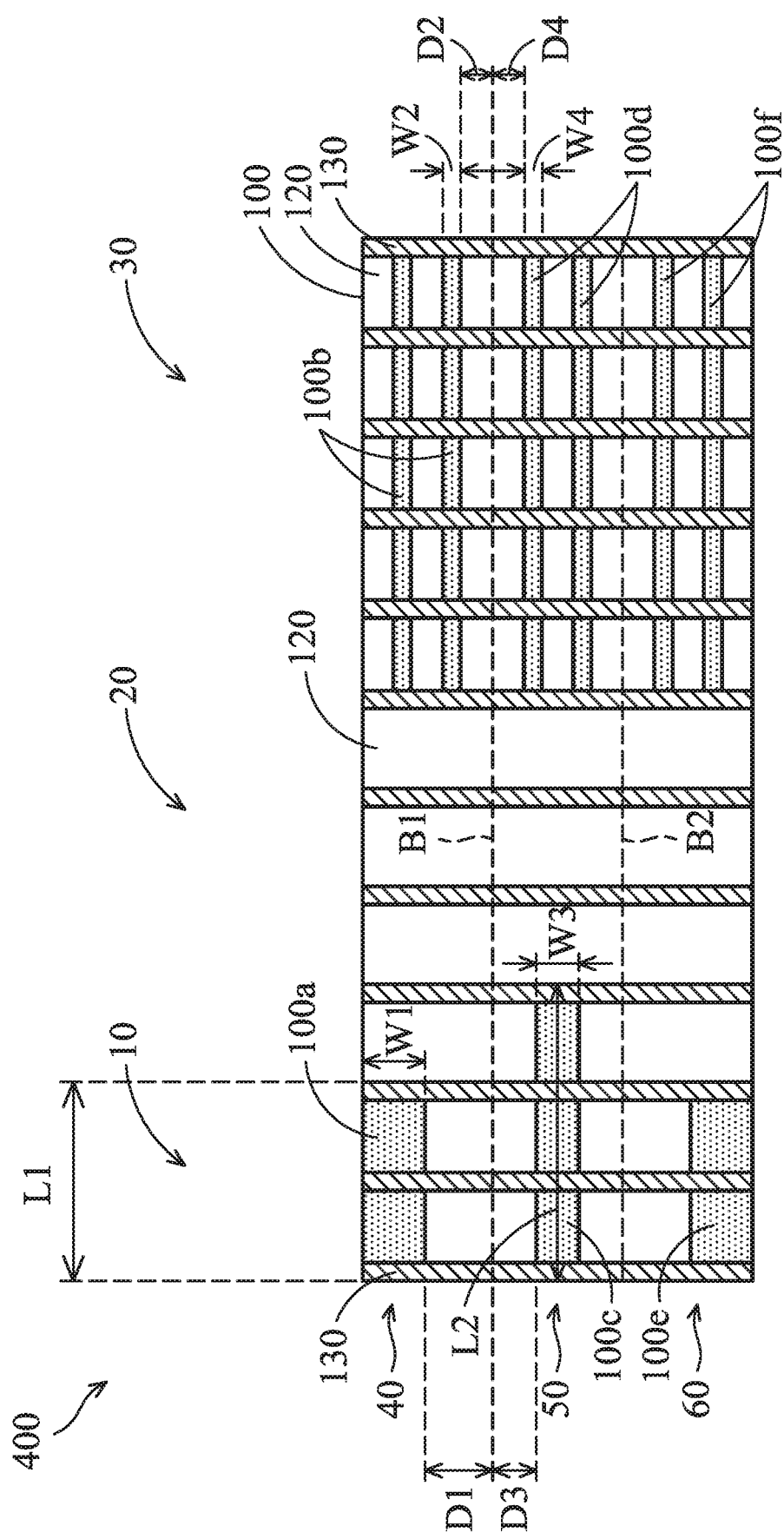
FIG. 6 is schematic top view showing a semiconductor device with fin structures in accordance with some embodiments.

FIG. 6 is schematic top view showing a semiconductor device 400 with fin structures in accordance with some embodiments. Elements in FIG. 6 that are the same as those in FIG. 1 are labeled with the same reference numbers as in FIG. 1 and are not described again for brevity. In some embodiments, the semiconductor device 400 is similar to the semiconductor device 200 shown in FIG. 1. The difference is at least the first fin length L1 of the semiconductor device 400 is different from the second fin length L2 of the semiconductor device 400. For example, the first fin length L1 is less than the second fin length L2, as shown in FIG. 6. As a result, at least one end of the first fin structure 100a is not aligned to the corresponding end of the third fin structure 100c. Alternatively, the first fin length L1 may be greater than the second fin length L2. In some embodiments, the semiconductor device 400 may be fabricated by the same or similar method shown in FIGS. 2A to 2F, 3A to 3F, and 4A to 4F.

Figure 7:
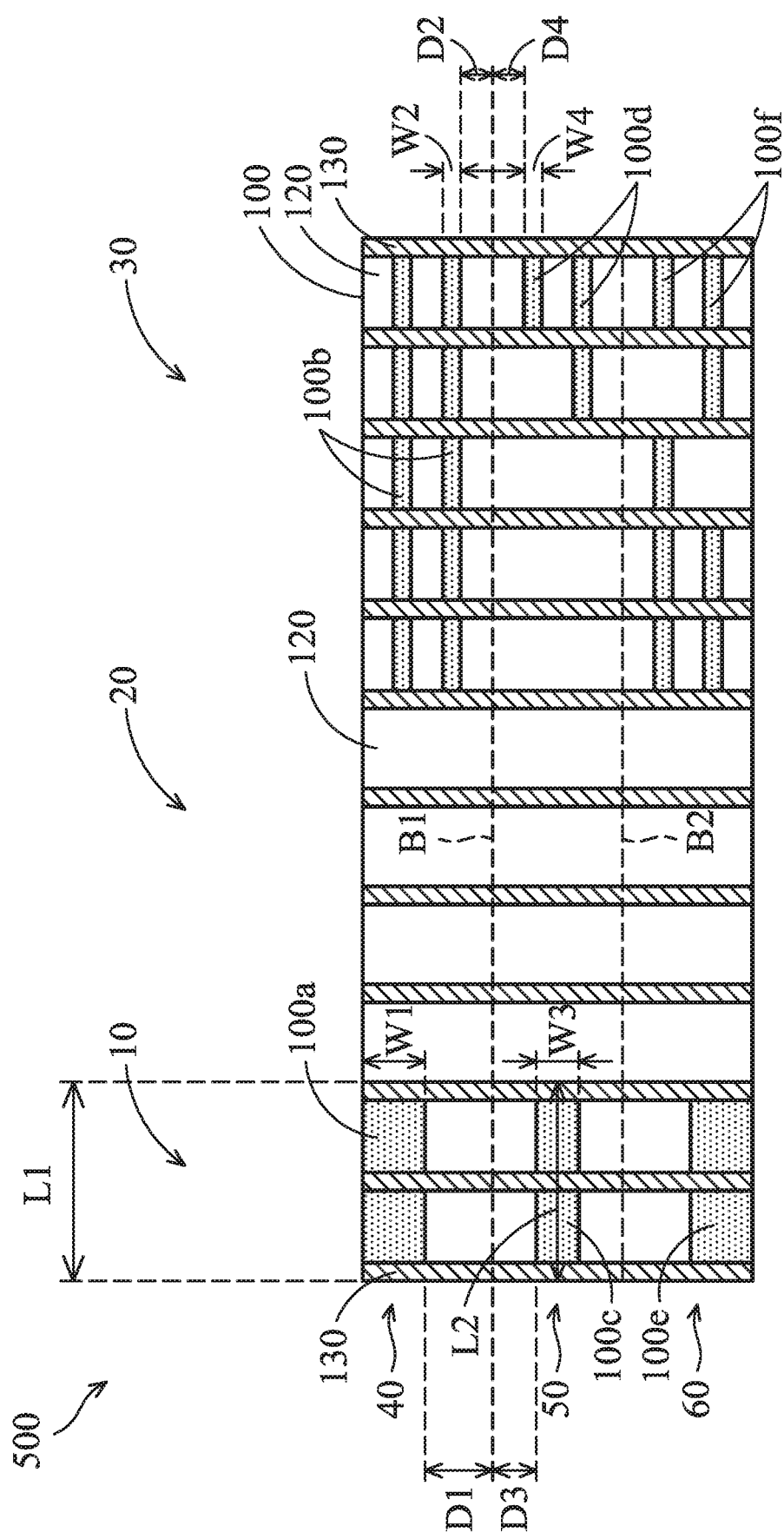
FIG. 7 is schematic top view showing a semiconductor device with fin structures in accordance with some embodiments.

FIG. 7 is schematic top view showing a semiconductor device 500 with fin structures in accordance with some embodiments. Elements in FIG. 7 that are the same as those in FIG. 1 are labeled with the same reference numbers as in FIG. 1 and are not described again for brevity. In some embodiments, the semiconductor device 500 is similar to the semiconductor device 200 shown in FIG. 1. A difference is one or more fin structures in the active region 30 may not extend into the dummy region. For an example, the fourth fin structures 100d formed in the active region 30 may not extend into the dummy region 20, as shown in FIG. 7. Another difference is one or more fin structures extending from the active region 30 into the dummy region 20 include a discontinuous structure. For example, each of the sixth fin structures 100f includes a discontinuous structure, as shown in FIG. 7. In some embodiments, the semiconductor device 500 may be fabricated by the same or similar method shown in FIGS. 2A to 2F, 3A to 3F, and 4A to 4F.

Embodiments of a semiconductor device structure and a method for forming the same are provided. A first fin structure, a third fin structure, and a fifth fin structure are formed in a well pick-up region of the semiconductor substrate. The first fin structure corresponds to a first well region. The third fin structure corresponds to a second well region and the fifth fin structure corresponds to a third well region. A first well boundary is formed between the first well region and the second well region. A second well boundary is formed between the second well region and the third well region. Second fin structures, fourth fin structures, and sixth fin structures are formed in an active region of the semiconductor substrate. The second fin structures correspond to the first well region. The fourth fin structures correspond to the second well region and the sixth fin structures correspond to the third well region. The first fin structure has a greater width than the width of each second fin structure. Similarly, the third fin structure has a greater width than the width of each fourth fin structure and the fifth fin structure has a greater width than the width of each sixth fin structure. The minimum distance between the first well boundary and the first fin structure is greater than the minimum distance between the first well boundary and one of the second fin structures that is closest to the first well boundary. The minimum distance between the first well boundary and the third fin structure is greater than the minimum distance between the first well boundary and one of the fourth fin structures that is closest to the first well boundary. Similarly, the minimum distance between the second well boundary and the third fin structure is greater than the minimum distance between the second well boundary and one of the fourth fin structures that is closest to the second well boundary. Similarly, the minimum distance between the second well boundary and the fifth fin structure is greater than the minimum distance between the second well boundary and one of the sixth fin structures that is closest to the second well boundary. In the well pick-up region, those minimum distances between the first fin structure and the first well boundary, between the third fin structure and the first well boundary, between the third fin structure and the second well boundary, and between the fifth fin structure and the second well boundary are not less than the maximum length of interdiffusion/depletion regions caused by the formation of the first, second, and third well regions.

Moreover, the first fin structure has a fin width greater than the width of each of the second fin structures. Similarly, the third fin structure has a fin width greater than the width of each of the fourth fin structures and the fifth fin structure has a fin width greater than the width of each of the sixth fin structures.

In some embodiments, in the well pick-up region of the semiconductor device, the minimum distances between the first fin structure and the first well boundary, between the third fin structure and the first well boundary, between the third fin structure and the second well boundary, and between the fifth fin structure and the second well boundary are designed to not less than the maximum length of interdiffusion/depletion regions caused by the formation of the first, second, and third well regions 40, 50, and 60. Accordingly, the resistance of first, third, and fifth fin structures in the well pick-up region 10 can be reduced while the fin-to-fin space in the active region is reduced, and thus the electrical performance of the semiconductor device is maintained or improved.

In some embodiments, the widths of the first, third, and fifth fin structures in the well pick-up region of the semiconductor device are respectively greater than the widths of the second, fourth, and sixth fin structures in the active region of the semiconductor device. Accordingly, the dopant depletion or dopant lost (which is caused by the well implantation processes) in the first, third, and fifth fin structures in the well pick-up region of the semiconductor device can be mitigated or eliminated. As a result, the resistance of first, third, and fifth fin structures in the well pick-up region can be prevented from increasing further while the size (e.g., the width) of fin structures in the active region is reduced. Additionally, as the widths of the first, third, and fifth fin structures in the well pick-up region of the semiconductor device are increased, the contact area between those fin structures and the corresponding contact structures (e.g., contact vias) can be increased, thereby reducing the contact resistance. As a result, voltage drop on the interface between the fin structures in the well pick-up region and the corresponding contact structures can be mitigated or eliminated.

In some embodiments, a semiconductor device structure is provided. The semiconductor device structure includes a semiconductor substrate having a well pick-up region and an active region adjacent to the well pick-up region. The semiconductor device structure also includes a first fin structure with a first width and a third fin structure with a third width formed adjacent to each other in the well pick-up region and a second fin structure with a second width and a fourth fin structure with a fourth width formed adjacent to each other in the active region. The first width is different than the second width, the third width is different than the fourth width, and the first width is substantially equal to or greater than the third width.

In some embodiments, a semiconductor device structure is provided. The semiconductor device structure includes a semiconductor substrate having a well pick-up region and an active region. Each of the well pick-up region and the active region includes a first well region having a first conductivity type. The semiconductor device structure also includes a first fin structure in the first well region of the well pick-up region and second fin structures in the first well region of the active region. The first fin structure has a first width and each second fin structure of the second fin structures has a second width less than the first width.

In some embodiments, a semiconductor device structure is provided. The semiconductor device structure includes a well pick-up region formed in a semiconductor substrate and an active region formed adjacent to the well pick-up region in the semiconductor substrate. The semiconductor device structure also includes a first fin structure formed in a first region of the well pick-up region and a second fin structure formed in a first region of the active region. The first region of the well pick-up region and the first region of the active region are doped with a first type of dopants. The semiconductor device structure further includes a third fin structure formed in a second region of the well pick-up region and a fourth fin structure formed in a second region of the active region. The second region of the well pick-up region and the second region of the active region are doped with a second type of dopants. The first fin structure has a first length and a first width, the second fin structure has a second length and a second width, the third fin structure has a third length and a third width, and the fourth fin structure has a fourth length and a fourth width. The first width is greater than the second width, and the third width is greater than the fourth width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a semiconductor substrate having a well pick-up region and an active region adjacent to the well pick-up region;
    a first fin structure with a first width and a third fin structure with a third width formed adjacent to each other in the well pick-up region; and
    a second fin structure with a second width and a fourth fin structure with a fourth width formed adjacent to each other in the active region,
    wherein the first width is different than the second width, the third width is different than the fourth width, and wherein the first width is substantially equal to or greater than the third width.

2. The semiconductor device structure as claimed in claim 1, wherein the first fin structure and the third fin structure have different conductivity types and the second fin structure and the fourth fin structure have different conductivity types.

3. The semiconductor device structure as claimed in claim 1, wherein the first fin structure is separated from the third fin structure by a first distance and the second fin structure is separated from the fourth fin structure by a second distance different than the first distance.

4. The semiconductor device structure as claimed in claim 3, further comprising:
    a fifth fin structure formed in the well pick-up region and adjacent to the third fin structures,
    wherein the fifth fin structure is separated from the adjacent third fin structure by the first distance, and
    wherein the fifth fin structure and the adjacent third fin structure have different conductivity types.

5. The semiconductor device structure as claimed in claim 1, wherein the first fin structure and the third fin structure have different lengths, and wherein the second fin structure and the fourth fin structure have a same length.

6. The semiconductor device structure as claimed in claim 1, wherein the first fin structure and the third fin structure have a same length, and wherein the second fin structure and the fourth fin structure have a same length.

7. The semiconductor device structure as claimed in claim 1, wherein the first fin structure and the third fin structure have a same length, and wherein the second fin structure and the fourth fin structure have different lengths.

8. A semiconductor device structure, comprising:
    a semiconductor substrate having a well pick-up region and an active region, wherein each of the well pick-up region and the active region comprises a first well region having a first conductivity type;
    a first fin structure in the first well region of the well pick-up region; and
    a plurality of second fin structures in the first well region of the active region,
    wherein the first fin structure has a first width and each second fin structure of the plurality of the second fin structures has a second width less than the first width.

9. The semiconductor device structure as claimed in claim 8, wherein the first fin structure has an edge spaced apart from an edge of the first well region of the well pick-up region by a first distance, and the one second fin structure of the plurality of second fin structures that is closest to an edge of the first well region of the active region is spaced apart from the edge of the first well region of the active region by a second distance that is different than the first distance.

10. The semiconductor device structure as claimed in claim 8, wherein each of the well pick-up region and the active region further comprises a second well region having a second conductivity type opposite to the first conductivity type adjacent to an edge of the first well region of the well pick-up region and the active region.

11. The semiconductor device structure as claimed in claim 10, further comprising:
    a third fin structure in the second well region of the well pick-up region; and
    a plurality of fourth fin structures in the second well region of the active region,
    wherein the third fin structure has a third fin width and each fourth fin structure of the plurality of fourth fin structures has a fourth fin width that is less than the third fin width.

12. The semiconductor device structure as claimed in claim 11, wherein the third fin structure is spaced apart from the edge of the first well region of the well pick-up region and the active region by a third distance, one fourth fin structure of the plurality of fourth fin structures that is closest to the edge of the first well region of the well pick-up region and the active region is spaced apart from the edge of the first well region of the well pick-up region and the active region by a fourth distance that is different than the third distance.

13. The semiconductor device structure as claimed in claim 8, further comprising a plurality of gate structures over the semiconductor substrate, wherein the plurality of gate structures is respectively across the first fin structure and the plurality of second fin structures.

14. A semiconductor device structure, comprising:
    a well pick-up region formed in a semiconductor substrate;
    an active region formed adjacent to the well pick-up region in the semiconductor substrate;
    a first fin structure formed in a first region of the well pick-up region;
    a second fin structure formed in a first region of the active region, wherein the first region of the well pick-up region and the first region of the active region are doped with a first type of dopants;
    a third fin structure formed in a second region of the well pick-up region; and
    a fourth fin structure formed in a second region of the active region, wherein the second region of the well pick-up region and the second region of the active region are doped with a second type of dopants,
    wherein the first fin structure has a first length and a first width, the second fin structure has a second length and a second width, the third fin structure has a third length and a third width, and the fourth fin structure has a fourth length and a fourth width, and
    wherein the first width is greater than the second width, and the third width is greater than the fourth width.

15. The semiconductor device structure as claimed in claim 14, wherein the first length is the same as the third length, and the second length is the same as the fourth length, and wherein the first length is different than the second length.

16. The semiconductor device structure as claimed in claim 14, wherein the first length is different from the third length, and the second length is the same as the fourth length, and wherein the first length and the third length are different than the second length.

17. The semiconductor device structure as claimed in claim 14, wherein the first length is the same as the third length, and the second length is different than the fourth length, and wherein the first length is different than the second length.

18. The semiconductor device structure as claimed in claim 14, two ends of the first fin structure are not aligned to corresponding ends of the third fin structure.

19. The semiconductor device structure as claimed in claim 14, further comprising:
   a dummy region formed in the semiconductor substrate and between the well pick-up region and the active region,
   wherein the second fin structure extends into a first region of the dummy region.

20. The semiconductor device structure as claimed in claim 14, further comprising a plurality of gate structures over the semiconductor substrate, wherein the plurality of gate structures is respectively across the first, second, the third, and the fourth fin structures.

* * * * *